United States Patent [19]

Campbell et al.

[11] Patent Number: 5,479,587
[45] Date of Patent: Dec. 26, 1995

[54] PAGE PRINTER HAVING ADAPTIVE DATA COMPRESSION FOR MEMORY MINIMIZATION

[75] Inventors: Russ Campbell; Gary Zimmerman; Thomas G. Berge; Terry M. Nelson, all of Boise, Id.

[73] Assignee: Hewlett-Packard Company, Palo Alto, Calif.

[21] Appl. No.: 940,111

[22] Filed: Sep. 3, 1992

[51] Int. Cl.[6] .................................................. G06K 15/00
[52] U.S. Cl. ........................ 395/116; 395/114; 395/115; 395/110
[58] Field of Search .................................. 395/100, 101, 395/110, 112, 114, 115, 116; 341/51, 65, 67, 55

[56] References Cited

U.S. PATENT DOCUMENTS

| | | | |
|---|---|---|---|
| 4,325,085 | 4/1982 | Godch | 358/261 |
| 4,558,302 | 12/1985 | Welch . | |
| 5,058,187 | 10/1991 | Kim . | |
| 5,129,049 | 7/1992 | Cuzzo et al. | 395/113 |
| 5,150,454 | 9/1992 | Wood et al. | 395/114 |
| 5,179,378 | 1/1993 | Ranganathan et al. | 341/51 |
| 5,260,693 | 11/1993 | Horsley | 341/67 |
| 5,367,620 | 11/1994 | Ito et al. | 395/161 |

FOREIGN PATENT DOCUMENTS

| | | | |
|---|---|---|---|
| 0465943 | 1/1992 | European Pat. Off. | G06K 15/12 |
| 3520028 | 12/1985 | Germany | G06K 9/36 |

OTHER PUBLICATIONS

IBM Technical Disclosure Bulletin, vol. 23, No. 12, May 1981 Data Compression Technique for APA Printer (Change Block Skipping), P. R. Spivey.

IBM Technical Disclosure Bulletin, vol. 23, No. 12, May 1981 Hybrid Data Compression Technique for Change Block Skipping in An APA Printer, P. R. Spivey.

*Primary Examiner*—Mark R. Powell
*Assistant Examiner*—Tracy M. Legree

[57] ABSTRACT

A peripheral unit converts an input data flow to page-arranged outputs and includes a random access memory capacity that is insufficient in size to accommodate an entire page of raster data. The peripheral unit also includes a processor and a control memory that holds a plurality of data compression procedures, each procedure exhibiting a different performance characteristic. The peripheral unit performs a method for compressing portions of the input data flow that includes the steps of: allocating the random access memory to portions of the input data flow; determining when an insufficient amount of random access memory is available for such allocation; employing a first data compression procedure on the input data flow portions to produce a compressed data portion; testing the compressed data portion to determine if a level of compression has been achieved that exceeds a threshold and, if not, employing succeeding data compression procedures and repeating the test for each procedure against a threshold, whereby the compression procedure that first enables a threshold level of compression to be achieved is the compression procedure employed to compress the data flow portion. Improved compression methods and techniques for handling input data flows with both integral and independent image descriptors are also described.

31 Claims, 17 Drawing Sheets

PAGE PRINTER HAVING ADAPTIVE DATA COMPRESSION FOR MEMORY MINIMIZATION

FIELD OF THE INVENTION

This invention relates to page printers, and more particularly, to a page printer having data compression facilities to accommodate a buffer memory size that is less than that required for a full page of printer data.

BACKGROUND OF THE INVENTION

Prior art page printers typically capture an entire page before any image is placed on paper. In such printers, formatting is either performed on the host computer (with large volumes of rasterized data being shipped to the printer), or on a formatter within the printer, Since a laser print "engine" operates at a constant speed, if new rasterized data is not available at a rate that keeps up with the engines's operation, a print "overrun" occurs and the page is not printable.

To prevent print overruns, a variety of techniques are in use. In one, a full raster bit map of an entire page is stored so that the print mechanism always has rasterized data awaiting action. At 300 dots per inch resolution, this technique requires approximately a megabyte of raster memory for each page. At 600 dots per inch, four megabytes of memory are required. Additionally, because laser printers achieve their rated speeds by pipelining of raster data, additional raster memory is needed to run the printer at its rated speed. Otherwise, composition of a following page cannot begin until a prior page has been ejected to the printer's output tray. To maintain the cost of laser printers at a low level, substantial efforts have been directed to reducing the amount of required raster memory.

One technique for memory reduction involves the construction of a page description. The page description is built in two steps: during formatting, data received from a host computer is converted into a list of simple commands, called display commands, that describe what must be printed. The second step prepares the display command list for printing and entails a parsing of the display commands and a rendering of the described objects into a raster bit map. This procedure requires a full page raster bit map memory because the same memory is used for succeeding pages.

To reduce the amount of required memory, the display command list procedure has been modified by sorting display commands according to their vertical position on a page. The page is then divided into sections called page strips or "page intermediate", and each page strip is passed, sequentially, to the print engine for printing. When display commands within a page strip are rendered into rasterized data at a fast enough pace, the same memory used to store a first page strip can be reused for a subsequent page strip further down the page (once the first page strip has been transferred to paper).

The Laser Jet III Laser Printer, manufactured by the Assignee of this application, employs a display command list algorithm and utilizes three raster buffers. The first buffer is reused on the fourth strip of a page; the second buffer is reused on the fifth strip, etc. For an eight page per minute printer, little time is left between the finishing of strip one and the time when strip four will be required by the print mechanism. If the strip is not delivered in time, a "print overrun" occurs and the page is incorrectly printed.

In U.S. patent application Ser. No. 07/701,235, entitled "Method and Apparatus For Preventing Print Overruns", assigned to the same Assignee as this application, a page printer determines total rasterization execution time for all display commands in each strip. If a strip's rasterization execution time exceeds a predetermined value, the strip is prerasterized, so as to reduce the time required during subsequent transfer of data to the print mechanism. The disclosure of the aforesaid patent application is incorporated herein by reference.

Most recently, 600 dot per inch resolution printers have been introduced to the marketplace. Such printers handle not only text but also line art and various types of images. To minimize the amount of memory required in such printers, data compression techniques are employed. For instance, run length data compression is used by host processors in the process of data transfer to the printer. In a run length encoding scheme, data that repeats is encoded by indicating the identity of the data and the run length of the repeat. Run length compression is successful when used with text and line art. When used with image data, however, such a compression scheme is much less satisfactory.

Certain types of images are classified as either "ordered dither" or "error diffused". An ordered dither image (also called "clustered") is a half-tone image that includes half-tone grey representations throughout the page. Such images generally reflect substantial data redundancy and lend themselves to lossless techniques of data encoding (e.g. run length). Error diffused images (also called "dispersed"), by contrast, exhibit little redundancy in their data and require different methods of compression. As a result, the use of a single data compression scheme in a page printer no longer enables such a printer to handle image data—while still maintaining a minimal amount of on-board raster memory.

In additional to run-length encoding, the prior art is replete with other data compression schemes. For instance, in U.S. Pat. No. 4,558,302 to Welch, the well known Lempel/Ziv/Welch (LZW) data compression technique is described. That procedure compresses an input data stream by storing, in a string table, strings of characters encountered in an input data stream. A "compressor" searches the input stream to determine the longest match to a stored string. As the compressor encounters more and more strings, it becomes "smarter" and enables succeedingly longer runs of characters to be compressed. Each match of an input string of characters to a stored table string causes a code to be transmitted to a receiver, where an identical string table resides that enables a decoding of the transmission.

Run length data compression on printer raster scan lines is described by Spivey in "Data Compression Technique for APA Printer (Change Block Skipping)" and "Hybrid Data Compression Technique for Change Block Skipping in an APA Printer", IBM Technical Disclosure Bulletin, vol. 23, No. 12, May 1981, pages 5464–5470. Spivey's procedure compares a current scan line to a corresponding scan line in a previous image and outputs codes in dependence upon the concurrence or lack of concurrence therebetween. Spivey also describes a hybrid technique which employs the aforesaid method in combination with run-length encoding.

Accordingly, it is an object of this invention to provide a page printer that includes a system for data compression and is adaptive in response to characteristics of received data.

It is another object of this invention to provide a page printer that employs a system that intelligently selects a data compression technique so as to enable efficient use of a limited amount of on-board memory.

It is yet another object of this invention to provide a page printer with a system for data compression, which system is selectively called upon when on-board memory is in a state where printing cannot continue unless data compression occurs.

It is still another object of this invention to provide improved data compression techniques for use in a page printer.

SUMMARY OF THE INVENTION

A peripheral unit converts an input data flow to page-arranged outputs and includes a random access memory capacity that is insufficient in size to accommodate an entire page of raster data. The peripheral unit also includes a processor and a control memory that holds a plurality of data compression procedures, each procedure exhibiting a different performance characteristic. The peripheral unit performs a method for compressing portions of the input data flow that includes the steps of: allocating the random access memory to portions of the input data flow; determining when an insufficient amount of random access memory is available for such allocation; employing a first data compression procedure on the input data flow portions to produce a compressed data portion; testing the compressed data portion to determine if a level of compression has been achieved that exceeds a threshold and, if not, employing succeeding data compression procedures and repeating the test for each procedure against a threshold, whereby the compression procedure that first enables a threshold level of compression to be achieved is the compression procedure employed to compress the data flow portion. Improved compression methods and techniques for handling input data flows with both integral and independent image descriptors are also described.

DESCRIPTION OF THE DRAWINGS

FIGS. 9 and 10 illustrate decompression matrices employed in accordance with findings of the procedure of FIG. 8.

DETAILED DESCRIPTION OF THE INVENTION

Hereafter, the invention will be described in the context of a laser printer, however it should be understood that other peripheral units such as plotters, facsimile units, etc. can also make use of the procedures contemplated by the invention hereof.

PRINTER SYSTEM

Figure 1:
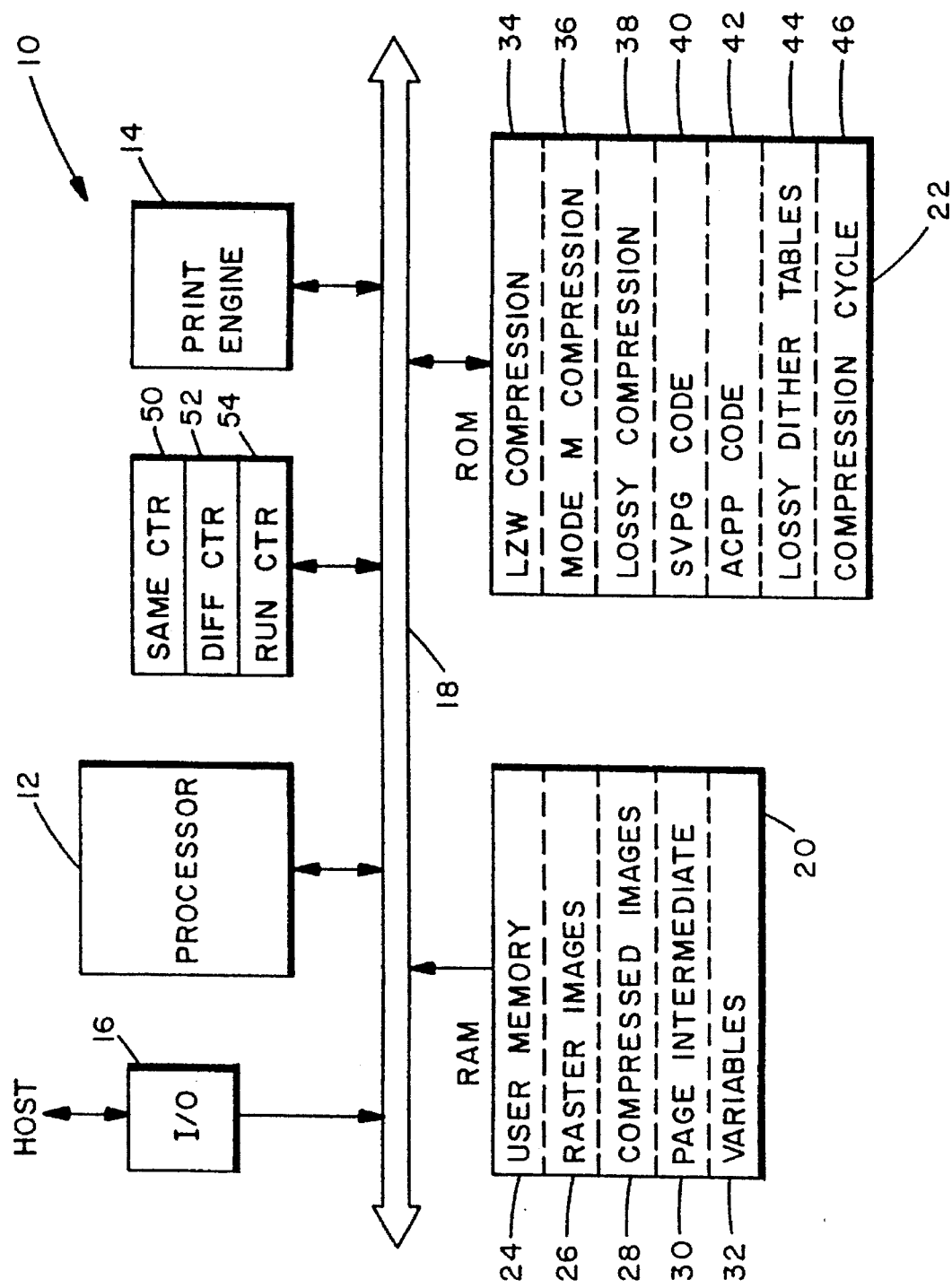
FIG. 1 is a high level block diagram of a peripheral unit that is adapted to carry out the invention.

In FIG. 1, printer 10 includes a processor 12, print engine 14, and an input/output (I/O) port 16, all connected by a bus 18. Print engine 14 comprises a laser printer which, when operated, runs at a constant speed and must be provided with video raster print data at a rate that keeps up with its operation. A random access memory (RAM) 20 and a read only memory (ROM) 22 are also connected to bus 18 and contain all of the procedures necessary to assure that available RAM 20 is most efficiently used, and that print engine 14 has data awaiting printing—so as to avoid print overruns.

Printer 10, in this example, is a page printer and receives image data from a host processor via I/O 16. The amount of memory in RAM 20 that is available to store the received image data is substantially less than that required to contain an entire video raster bit-map image of a page. The size of RAM 20 is constrained so as to enable printer 10 to be marketed at the lowest competitive price.

Image data from the host processor is received via I/O module 16 and read into RAM 20. The image data may take one of several forms. It may include subimages wherein descriptors are contiguous with each subimage and are processed along with each subimage. When such image data is received, it is the image data itself that is examined to determine whether data compression is required or not. In a second version of the invention, subimage descriptors are received separately from (but linked to) the actual subimage data. In the second version, data within the descriptor and other image-specific data is employed to assist in determining which (if any) of a series of data compression techniques should be applied to the subimage data.

In both versions of the invention, when printer 10 receives image data, it is parsed and commands and data are processed to derive raster graphics data that is stored in RAM 20. At such time, subimages are created. Next, the subimages contained in the raster graphics data base are linked into an intermediate page representation ("page intermediate"). Page intermediate is a means of representing an entire page of information in a format that is easily convertible to video, while consuming as little memory as possible. Page intermediate actions essentially divide a page into a plurality of strips, each strip including a prescribed number of "instruction buckets". Each strip is allocated a height (e.g., 128 dots) and contains a pointer to a chain of instruction buckets (e.g. each bucket being 256 bytes in size), each "bucket" containing instructions which define how raster video should be created for the strip. Subimages (and other intermediate objects) that span more than one strip have an instruction for each strip in which they are resident.

In the conversion of the raster graphics data to page intermediate, it may become evident that the contents of a strip exceed a threshold that is based upon the size of the strip's video buffer. It also may occur that after conversion of a plurality of strips, insufficient memory remains to complete the page intermediate conversion. Further, after conversion of an entire page it may become clear that the page is too complex to be stored within the available RAM. In all of the above cases, the system hereof performs data compression actions in an attempt to overcome the memory limitations. In each case, one of a plurality of compression techniques is chosen, in dependence upon the examination of variables then in existence. In such manner, an informed choice of a compression procedure is made so as to enable a most rapid and effective use of available RAM.

Hereafter, three methods of data compression will be described, and it is to be understood that the choice of which data compression method to use is dependent upon the performance characteristics desired from the printer mechanism. For highest speed compression, a procedure entitled mode-m (where m means multi-dimension changes) compresses a raster image data block on a run-length basis applied to raster scan rows and on the basis of changes from row to row. Mode-m is an extremely fast method of data compression (and decompression), but is not effective to compress certain types of image data. Mode-m is a "lossless" compression technique (no image data is lost during the compression technique that cannot be recovered upon decompression).

A further lossless compression technique, which is slower in action than mode-m, but is more effective with certain types of image data is a modified Lempel/Ziv/Welch (LZW) procedure. A third "lossy" compression procedure is employed which typically guarantees a compression ratio of at least 4:1, but results in the loss of some image data that cannot be recovered upon decompression.

Returning to FIG. 1, the subroutines employed in the data conversion and compression procedures are listed in RAM 20 and ROM 22. RAM 20 includes a memory area 24 allocated for the user; an area 26 allocated to the storage of raster images; an area 28 for compressed images, an area 30 for page intermediate data storage, and an area 32 allocated to the storage of variables used with the procedures to be described hereinafter.

ROM 22 contains subroutines that carry out LZW compression (34), mode M compression (36) and lossy compression (38). ROM 22 further also contains an area 40 storing a procedure for carrying out "strip video pre-generation" (SVPG); an area 42 with a procedure for carrying out "adaptive compressed page protection" (ACPP); an area 44 that contains lossy dither tables which enable, upon decompression, a lossy decompressed image to more effectively represent the original (notwithstanding a loss of data), and an area 46 which contains a procedure for performing data compression using one or more compression procedures found in areas 34, 36 and 38.

During the operation of the procedure which carries out mode m compression, a plurality of counters 50, 52 and 54 are employed to enable tracking of certain compression counts. The operation of such counters will be considered below.

GLOBAL FLOW DIAGRAM

Figure 2:
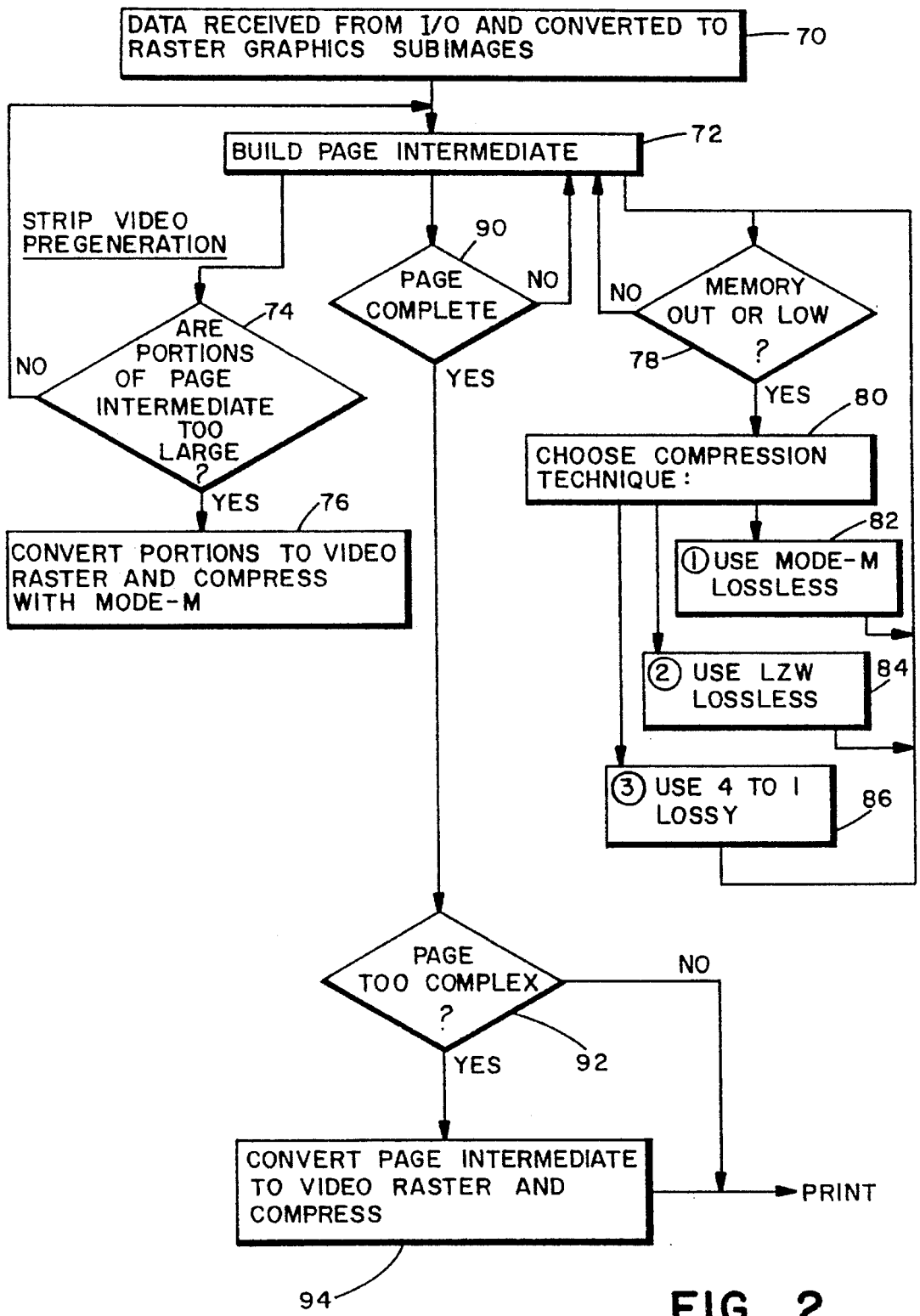
FIG. 2 is a global flow diagram illustrating the overall procedure of the invention hereof.

Turning to FIG. 2, a global flow diagram illustrates actions taken by printer 10 during the course of the generation of a page. Initially, data is received from a host processor (box 70) and is subjected to preprocessing to derive raster graphics subimages. The subimages are then employed to build the page intermediate strips of the image data (box 72). As above mentioned, this procedure comprises the allocation of graphics subimages to page strips, each strip composed of instruction buckets, each of a predetermined size, and possibly containing sub-image instructions of a predetermined size. Printer 10 also preallocates area 30 of RAM 20 to hold the raster video bit maps that result from conversion of strips of page intermediate (generally three). Thus, while printer 10 may divide a page into 10 or more strips, RAM 20 is only capable of holding raster video bit maps which result from three strips of page intermediate.

Once each page intermediate strip is completed, printer 10 converts instructions within each strip into raster video bit map data and stores the data in RAM area 26 which is subdivided (in this example) into three raster buffer areas. When all three buffer areas (RAM area 26) are full, print engine 14 is started and raster video information stored therein is fed thereto under control of processor 12. While raster video data is being read into print engine 14, the process of converting page intermediate into strip buffer video continues, using buffer areas for which data transfer to print engine 14 has been completed.

In the process of building page intermediate, it may occur that the number of instructions is too large for a strip (decision box 74). If so, the raster graphics portion found to be too large is immediately converted to a video raster data and compressed using a lossless compression technique, e.g. mode-m (box 76). Further details regarding this procedure will be described below with respect to FIG. 3.

During the construction of page intermediate, track is kept of the amount of strip raster buffer area 26 that is available. If it is determined (decision box 78) that remaining strip raster buffer area is either "low" or "out", the procedure branches to determine whether graphics image data referred to by the page intermediate instructions can be data compressed to free-up additional memory. Thus, the procedure moves to choose a compression technique (box 80). Initially, mode-m lossless compression is tried (box 82) and if it causes removal of the memory out or low condition, the procedure exits and continues building page intermediate (box 72). In general, if the memory out or low condition remains, a lossless LZW compression procedure is employed (box 84) and the memory out/low test is repeated. Here again, if the memory out/low indication remains, a lossy compression procedure (box 86) is tried and, again, the results are tested to determine if the memory out or low condition has been removed. If the memory out or low condition continues, the page cannot be printed. However, in most cases, the lossy compression technique will remove a memory out or low condition, as it usually achieves a 4:1 data compression.

Once page intermediate strip processing is complete (decision box 90), the page intermediate data is parsed to estimate the time it will take to render it into video raster bit map data. If the estimated time is longer than print engine 14 allows, adaptive compressed page protection (ACPP) is implemented and a "page too complex" indication is issued (decision box 92). Under such a condition, strips of the page intermediate exhibiting a high level of complexity are processed in order down the page and are converted to raster and placed in a temporary buffer. Then, compression techniques are employed on the raster data strips in an attempt to remove the "page too complex" indication and to fit the converted strips in available RAM.

Once each of the strips has been converted and compressed (if possible), an attempt is made to find storage for them in RAM 20. Since the complexity of compressed objects is generally much lower than the maximum complexity allowed by print engine 14, a page prints without a print overrun.

STRIP VIDEO PRE-GENERATION

Figure 3:
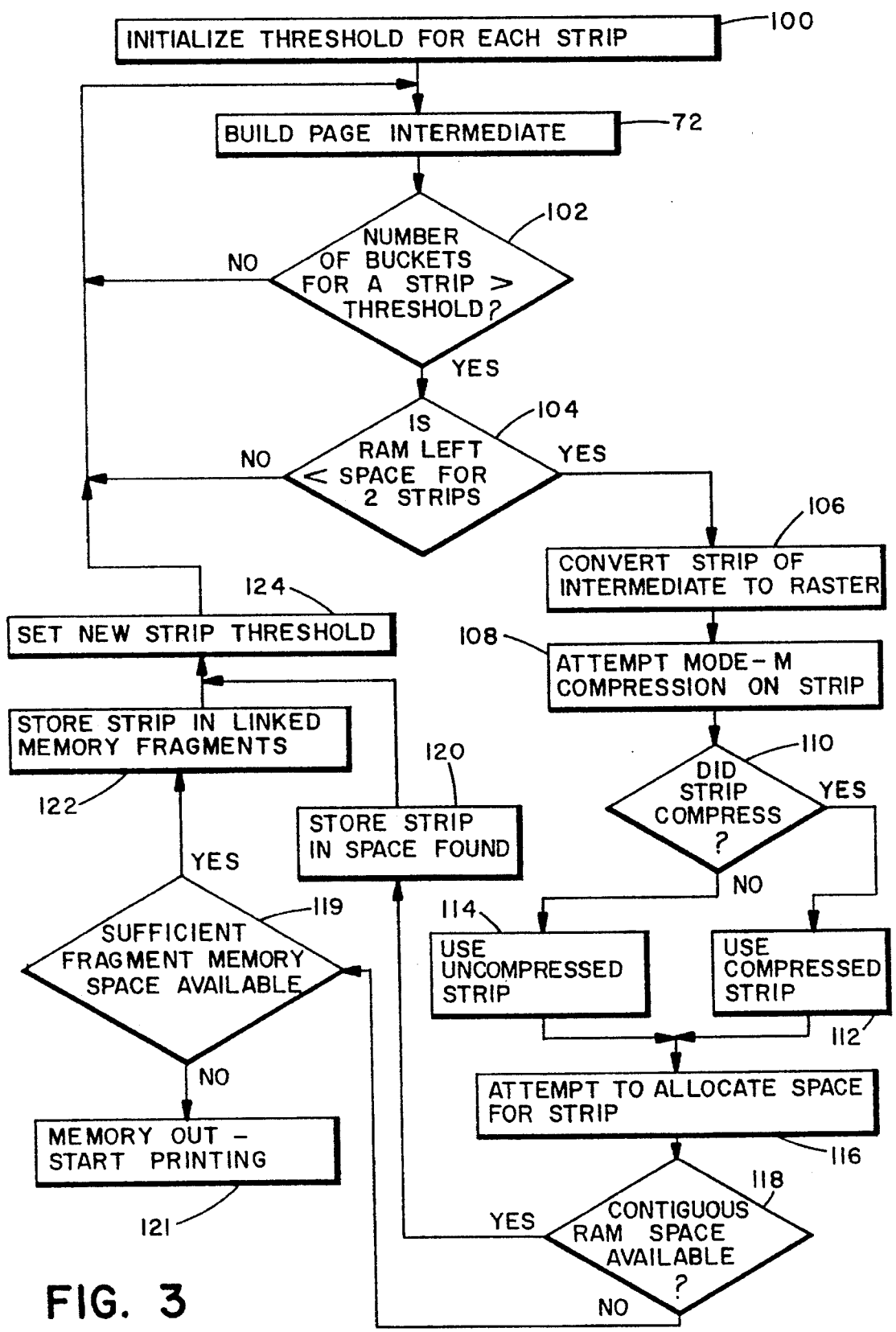
FIG. 3 is a high level flow diagram illustrating the procedure for strip video pre-generation.

Turning now to FIG. 3, procedures employed during strip video pre-generation (as shown in boxes 74, 76 in FIG. 2) will be described. When a page is opened, a page intermediate size threshold for each strip is set (box 100). The threshold is set in units of buckets, with a bucket being the smallest allocated unit of page intermediate storage. In this example, it is assumed that a bucket is approximately 256 bytes long. Buckets are linked together, if needed, to store a strip's page intermediate data. The bucket threshold is calculated by dividing the amount of available printer memory by the product of the number of strips on a page times the number of bytes per bucket. Assuming an available memory of approximately 800,000 bytes, the threshold is set at approximately 125 buckets and each strip's threshold is initialized to that value.

Next, page intermediate processing commences (box 72) to create page intermediate data structures. If at any time during the process of converting raster graphics to page intermediate, it is determined that the number of instruction buckets for a strip exceeds the previously set threshold, that strip may need to be immediately converted to raster and compressed to conserve printer memory. Thus, decision box 102 provides a yes output when the threshold is exceeded. Then, it is determined if the remaining RAM for strip raster bit maps is less than the space required for two strips (decision box 104). If the answer is no, page intermediate construction continues. If however the answer is yes (insufficient RAM left to hold two strips), the strip that exceeds the threshold has its page intermediate data immediately converted to raster video data (box 106).

The condition indicated in decision box 104 avoids converting strips to raster video data when there is sufficient memory to store more page intermediate without the conversion. Thus, pages which do not need video pregeneration do not have to pay a time penalty just because a few strips upon the page are very large (and the rest are small).

Once the "too large" strip is converted to raster video, an attempt is made to compress the strip's data using mode-m compression (box 108), to be described below. If the strip video data compressed as a result of the mode-m compression action (decision box 110) the compressed strip is used (box 112). If the strip did not compress, the uncompressed strip is employed (box 114). It should be noted that under certain circumstances, compression techniques result in expansion of strip data. In such a circumstance, the uncompressed strip data is employed in lieu of the expanded strip data.

Next, an attempt is made to allocate space for the strip raster video in RAM 20 (box 116). If contiguous memory space is available (decision box 118), the strip is stored in the memory space (box 120); whereas if a contiguous space in memory is not found and sufficient fragmented memory space is available (decision box 119), the strip is stored in linked memory fragments within RAM 20 (box 122). If there is either insufficient contiguous or fragmented memory space, a "memory out" occurs and printing of the page continues (box 121) so that whatever can be printed is printed.

Once a strip is stored in memory, a new bucket threshold for the strip is established, based upon current memory conditions (box 124). This threshold is calculated similarly to the initial threshold, with the exception that the number of buckets that the just converted strip consumed is subtracted. Thus, the new threshold is equal to the old threshold value (adjusted for changes in amount of available RAM) less the size of the converted video raster strip, divided by the number of bytes per bucket. This adjustment of the threshold causes it to become smaller as strips are converted and less memory becomes available. Once the new threshold is set (box 124), the building of page intermediate continues (box 72).

The procedure shown in FIG. 3 occurs in advance of any indication of either a memory out or memory low. It acts to anticipate a memory constraint that arises as a result of the existence of complex strips of page intermediate data. It may, however, occur during the processing of page intermediate that a plurality of complex strips result in a memory out or memory low indication without any one strip causing the strip video pregeneration threshold to be exceeded. In such instance, the procedure moves to attempt to compress page intermediate raster graphics data by making a selection from amongst compression schemes that are available within printer 10.

Figure 4:
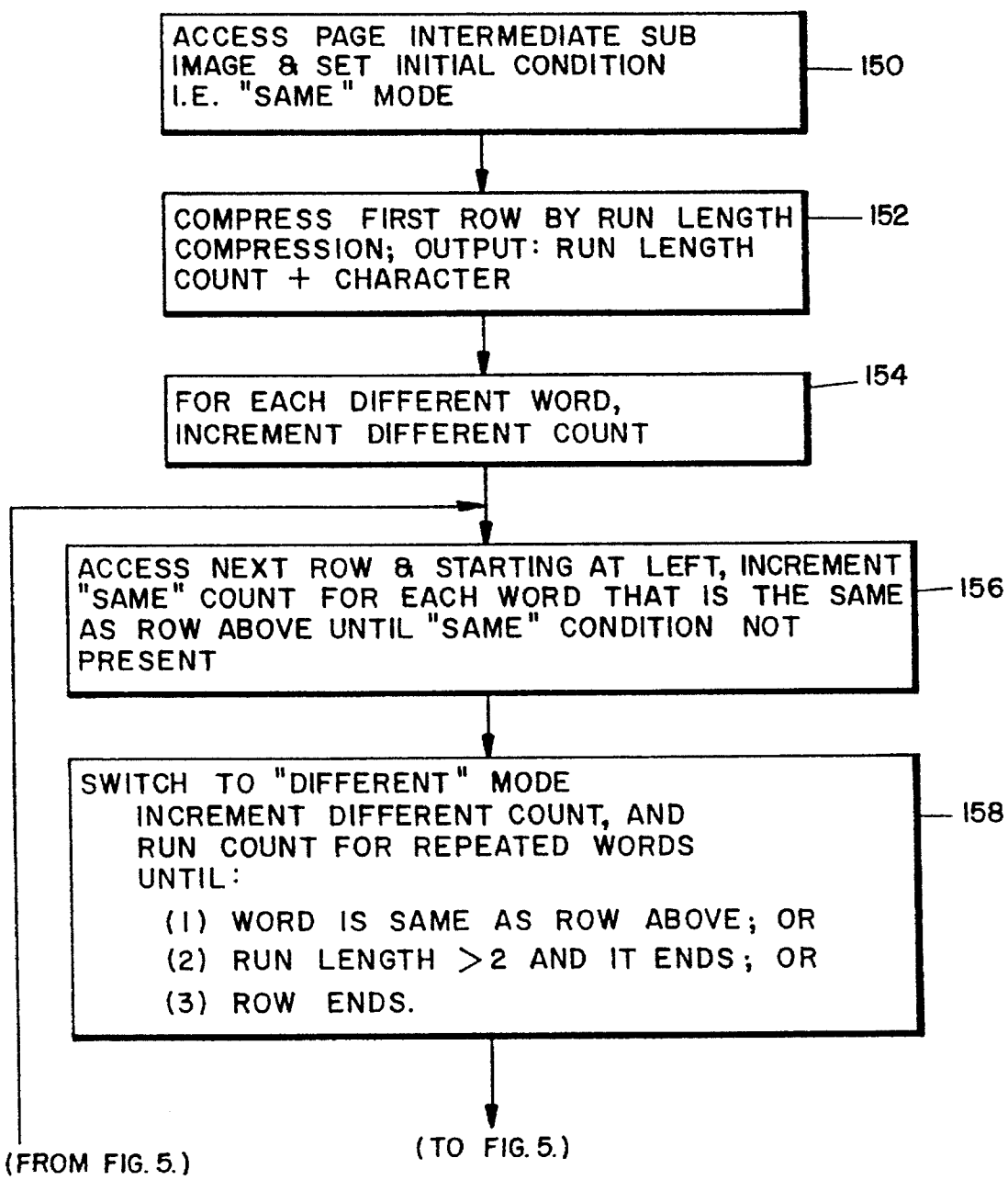
FIGS. 4 and 5 are a high level flow diagram of a high speed data compression technique, termed mode-m, that is employed herewith.
Figure 5:
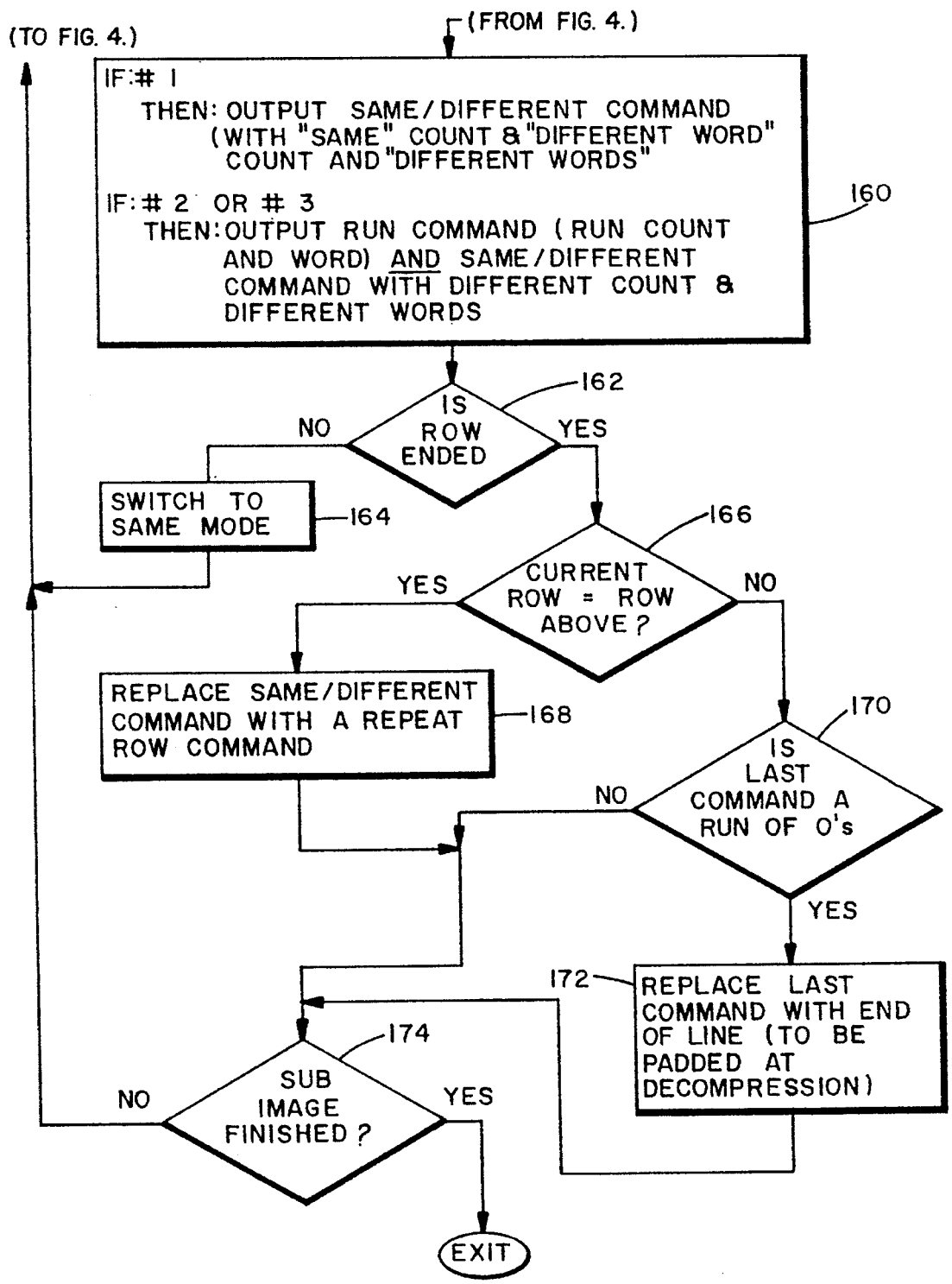

Prior to describing the decision procedure that enables a compression procedure to be chosen, each of the compression procedures contained within RAM 22 will be considered. Turning to FIG. 4, the details of mode-m compression will be considered first.

MODE-M COMPRESSION

Mode-m compression considers a raster bit map block of page intermediate data and attempts to compress the block using run length encoding for each row and by encoding delta changes that occur from row to row within the block. It is to be understood that the term "row" as used herein refers to an arbitrary length of data that may or may not be equal in size to a raster scan row of the image.

The mode-m procedure uses "same", "difference" and "run" counters, 50, 52 and 54 that are shown in FIG. 1. The mode-m compression procedure commences by accessing a page intermediate subimage block and setting one of two initial condition for the procedure i.e., "same" and "different". The "same" initial condition enables a count to be accumulated each time a word on a row of a block is the same as a vertically aligned word on a preceding row. This count is entered into "same" counter 50. By contrast, when the "different" condition is active, difference counter 52 is incremented each time a word on one row is different from a vertically aligned word on a previous row. A third counter i.e., run counter 54, is employed to keep a count of a run length of identical words that occur in a row.

Returning to FIG. 4, it is assumed that the initial condition is set to "same" (box 150). The first row of the subimage block is then considered and run length compression is performed thereon in the known manner (box 152). To the extent that there are any run lengths of characters, a run length command is issued for each "run" character and the count of the "run". In addition, the remaining characters of the row are output as "difference" word data in "same/ different" commands (as described below) where the same value is 0. Further (as shown in box 154), since each word in the first block row is "different" by definition (as there is no row above the initial row), the difference count is incremented in difference counter 52 and is reset at the end of the row (and at the end of each run within the first row). Then, the next row is accessed and, starting at the left, each word is examined to determine if it is the same as the word that is vertically aligned in the immediately preceding row. For as long as the same condition is satisfied, "same" counter 50 is incremented until a word is encountered that is different from the vertically aligned word in the preceding row (box 156).

The procedure then switches to a "different" mode and increments a "different count" in counter 52 so long as the "different" condition is satisfied. To the extent required, a run count in run counter 54 is entered for repeated "different" words. This "tunes" the process for a high decompression speed, i.e., not counting "runs" during the "same" mode. A higher compression ratio would be achieved by considering run counts during the same mode also.

At each mode condition switch, a same/different command is issued that includes a "same" count, a "different" count and the "different" words that follow the "same" words. The different mode continues until (1) a word is encountered in the row that is the same as a vertically aligned word in the row above; or (2) a run length is encountered that is greater than two and it ends; or (3) the row ends (box 158). Keeping in the mind that the procedure is still in the "different" mode, when a word is encountered that is the same as the row above, a condition switch back to "same" is made and a same/different command is output, as described above. If a run length of greater than two is encountered and it ends, a run command is outputted including a run count and the word that is run. A same/different command is also outputted with a difference count from difference counter 52 and the different words that were experienced (box 160). This difference count does not include a count of run data.

At this point it is determined whether the row has ended (box 162) and if not, a switch is made to the same condition (box 164) and the procedure recycles back to box 156 in FIG. 4. By contrast, if the row has ended, then it is determined whether the entire current row is the same as the row above (decision box 166). If yes, the same/difference command issued for the row is replaced with a "repeat row" command that is significantly more compact than the same/difference command. If however, the current row is not the same as the row above, then it is determined whether the last issued command indicated a run of zeros (decision box 170). If yes, the last command is replaced with an end-of-line code, realizing that the line will be padded with zeros at decompression time (box 172). At this stage, it is determined whether the subimage block has been finished and if yes, the mode-m compression procedure exits. If not, the procedure cycles back to box 156 and continues with a next row. An alternative approach can ignore an end-of-row boundary and cause the "same" or "difference" counts to span across an end-of-row boundary. Data compression may be somewhat improved by this feature.

The mode-m data compression, decompression procedures are extremely fast and can be employed on-the-fly by a laser printer. As such, it is generally the first compression technique chosen (with some exceptions). If after using mode-m, a memory out or low indication still is present, a second lossless technique is employed, e.g., LZW. LZW compresses and decompresses in a lossless mode, but at a slower rate than mode-m. However, by constraining the length of the code that is output as a result of a match in an LZW table (e.g. to 3 codes per 32 bit word), its speeds of compression and decompression can be increased. LZW, however, cannot compress dispersed images (mode-m also cannot). To avoid the time ,waste that would occur if LZW is used in an attempt to compress a dispersed image, such an image is detected, in part, by determining when a mode-m compression results in a compression ratio that is less than 1.125 to 1, and if so found an image is determined to be dispersed. LZW is not employed on such an image as it is known that it will fail to provide data compression.

CLUSTERED/DISPERSED DETERMINATION

A clustered image is one which exhibits regularly spaced dots and can be lossless compressed through use of mode-m, LZW or other techniques. By contrast, a dispersed image is one wherein the dots have no regular recurring pattern and thus does not lend itself to a lossless compression method. An image or a subimage may be classified as either clustered or dispersed by comparing the image's binary values to entries in a "neighbor table" (shown below). For each byte of the image that matches an entry in the clustered portion of the neighbor table, a value of +1 is assigned. For each byte that matches an entry in the "dispersed" portion of the neighbor table, a value of −1 is assigned. All other bytes from the image that do not match an entry in the table are "don't knows" and are assigned a 0 value. At the end of an image comparison, the assigned values are summed and if a negative value is indicated, the image is assumed dispersed whereas if a plus value results, the image is assumed clustered. The following indicates entries in a neighbor table that would enable such a classification to occur:

| Neighbor Table for Predicting Image Type | | |
|---|---|---|
| Binary Value | Indication | Value |
| 00001110 | Clustered | 1 |
| 00011100 | Clustered | 1 |
| 00011110 | Clustered | 1 |
| 00100100 | Clustered | 1 |
| 00110011 | Clustered | 1 |
| 00111000 | Clustered | 1 |
| 00111100 | Clustered | 1 |
| 00111110 | Clustered | 1 |
| 01001001 | Clustered | 1 |
| 01100110 | Clustered | 1 |
| 01110000 | Clustered | 1 |
| 01111000 | Clustered | 1 |
| 01111100 | Clustered | 1 |
| 01111110 | Clustered | 1 |
| 10010010 | Clustered | 1 |
| 11001100 | Clustered | 1 |
| 00010100 | Dispersed | −1 |
| 00100110 | Dispersed | −1 |
| 00101000 | Dispersed | −1 |
| 00110110 | Dispersed | −1 |
| 01010101 | Dispersed | −1 |
| 01011010 | Dispersed | −1 |
| 01011101 | Dispersed | −1 |
| 01100100 | Dispersed | −1 |
| 01101100 | Dispersed | −1 |
| 10010101 | Dispersed | −1 |
| 10011010 | Dispersed | −1 |
| 10100101 | Dispersed | −1 |
| 10101001 | Dispersed | −1 |
| 10111010 | Dispersed | −1 |

LZW COMPRESSION

Figure 6:
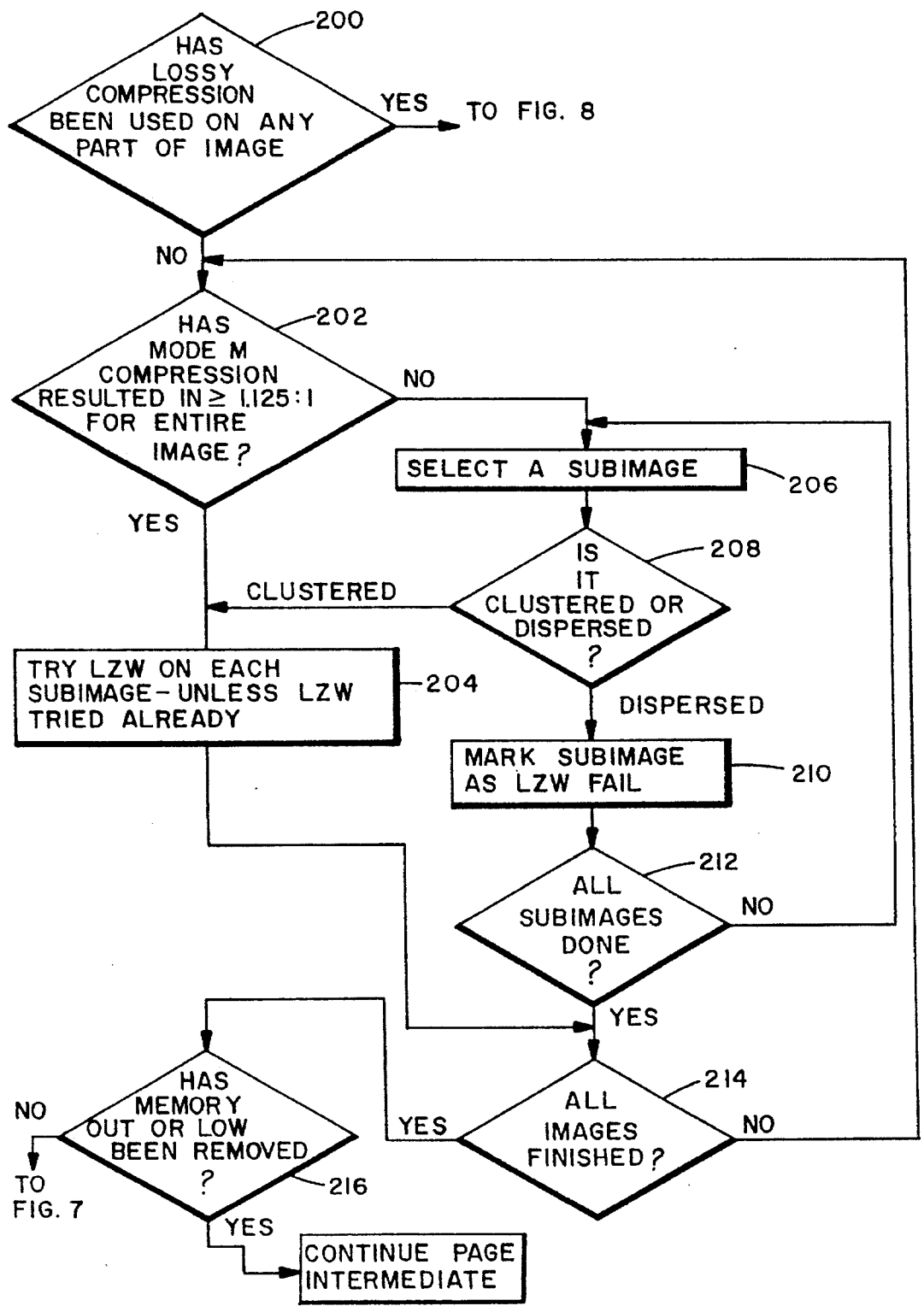
FIG. 6 is a high level flow diagram illustrating the Lempel/Ziv/Welch data compression procedure.

Turning to FIG. 6, it is assumed that mode-m has already been tried as a compression procedure and that a decision has been made to attempt LZW. As shown in decision box 200, the first query is whether a lossy compression technique has been used on any part of the image. If so, the LZW procedure is aborted and lossy compression is continued with the portion of the image being examined. (Once lossy compression has been applied to a subimage, image esthetics are lost if lossless compression techniques are utilized on only a portion of the image.

If lossy compression has not been used on any portion of the image, it is next determined whether modem compression resulted in at least a 1.125:1 compression ratio for the entire image (box 202). If yes, it is assumed that the image is clustered and the procedure moves to box 204 where the LZW procedure is tried on each subimage, unless LZW was previously tried.

By contrast, if the mode-m resulted in a compression ratio of less than 1.125: 1, then a subimage from the image is selected (box 206) and a determination is made whether the subimage is clustered or dispersed—using the neighbor table in the manner described above. If the subimage is determined as clustered (decision box 208), then the procedure tries the LZW compression technique on the subimage. If however, the subimage is determined as dispersed, then it is known that LZW will not compress it and the subimage is marked as "LZW fail" (box 210).

At this point, it is determined whether all subimages within the image have been tested (decision box 212) and if not, the procedure cycles back to box 206 and continues. If all of the subimages have been tested, then it is determined whether all images are finished and if not, the procedure cycles back to decision box 202 and continues (decision box 214). If yes, the memory out or low indication is examined (decision box 216) to determine if the indication has been removed. If yes, page intermediate processing continues. If no, the procedure moves to try a lossy compression technique.

LOSSY COMPRESSION

The Lossy compression procedure is used as a last resort because it results in lost data which cannot be recovered. The Lossy compression technique is mainly intended for use on images that cannot be compressed using lossless techniques. Images that generally fall into this category are images that have been half-toned using an error diffusion procedure (i.e., "dispersed").

Figure 7:
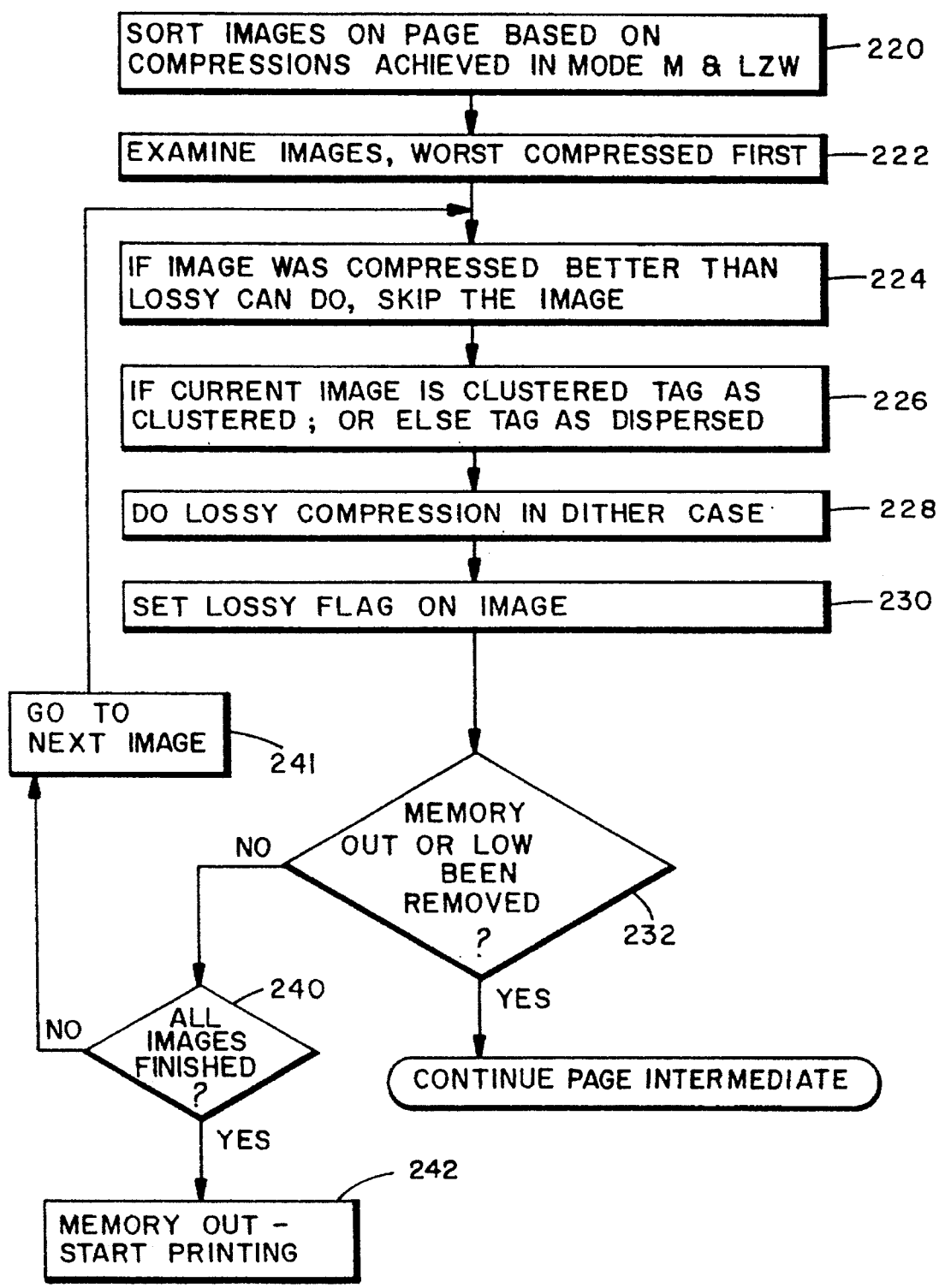
FIG. 7 is a high level flow diagram illustrating a Lossy compression procedure.

As shown in FIG. 7, the Lossy compression technique commences by first sorting images on the page based upon levels of data compression achieved previously through the use of mode-m or LZW (box 220). Next, the worst-compressed image is examined first (box 222) and if the image was compressed better than Lossy can do, it is skipped (box 224). As an example, it will be assumed that 4×4 bit cells of raster video data are compressed to a four bit word. Thus a 4:1 compression is achieved through the use of Lossy. However, if greater than 4:1 compression was previously achieved by a lossless technique, no attempt is made to use Lossy. Recall, that each compression procedure is applied to an uncompressed version of the image or subimage and a compressed image or subimage is never further compressed unless it is first decompressed.

At this stage, the current image is examined and tagged to indicate if it is clustered or dispersed (box 226) and, in either case, Lossy compression is performed (box 228). The tag is used during decompression, as will become apparent. Once the image has been compressed, a lossy flag is set and associated with the image so that all subimages within the image can be lossy compressed (box 230). It is then determined whether the memory out or low indication has been removed (decision box 232). If no and all images are finished (decision box 240), printing action commences (box 212) even though a memory out condition remains, otherwise a next image is accessed (box 241) and Lossy compression is performed on it. Once the memory out or low indication is removed (decision box 232), the procedure continues with page intermediate conversion.

Figure 8:
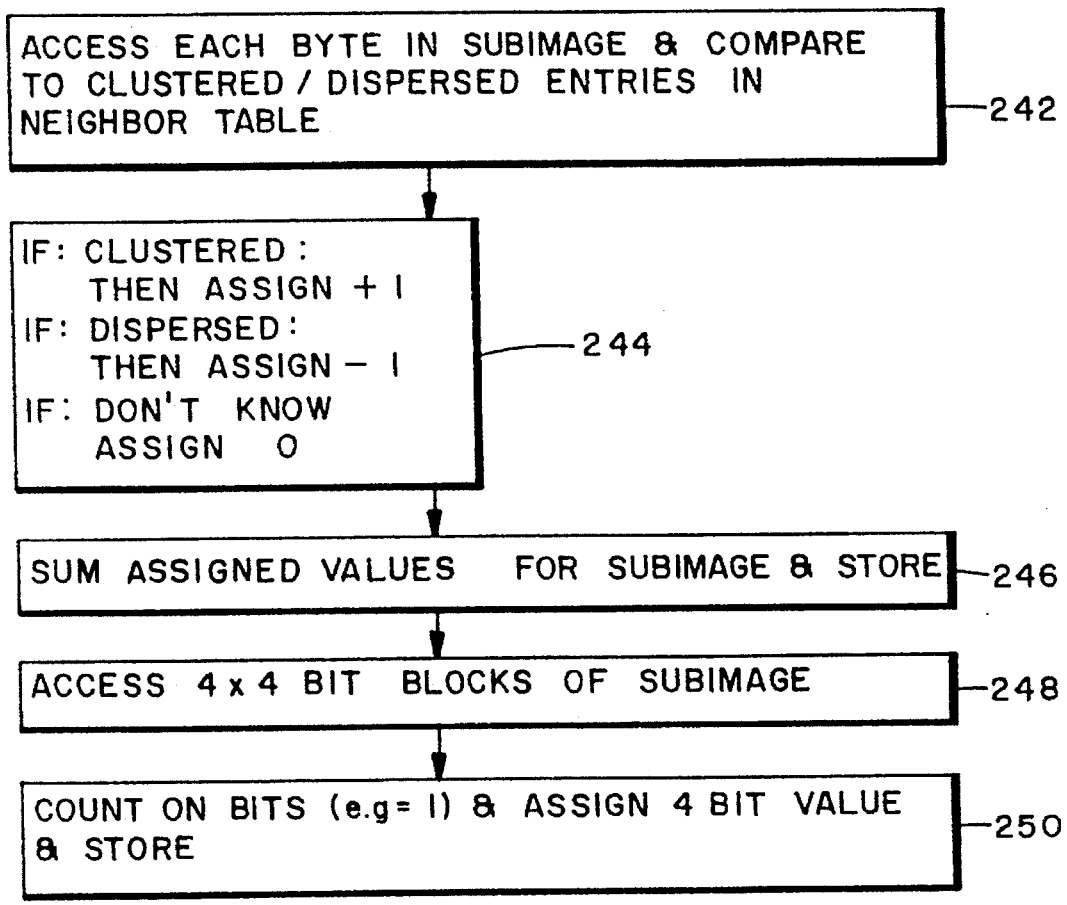
FIG. 8 is a high level flow diagram illustrating the procedure employed to determine whether an image is clustered or dispersed.
Figure 9:
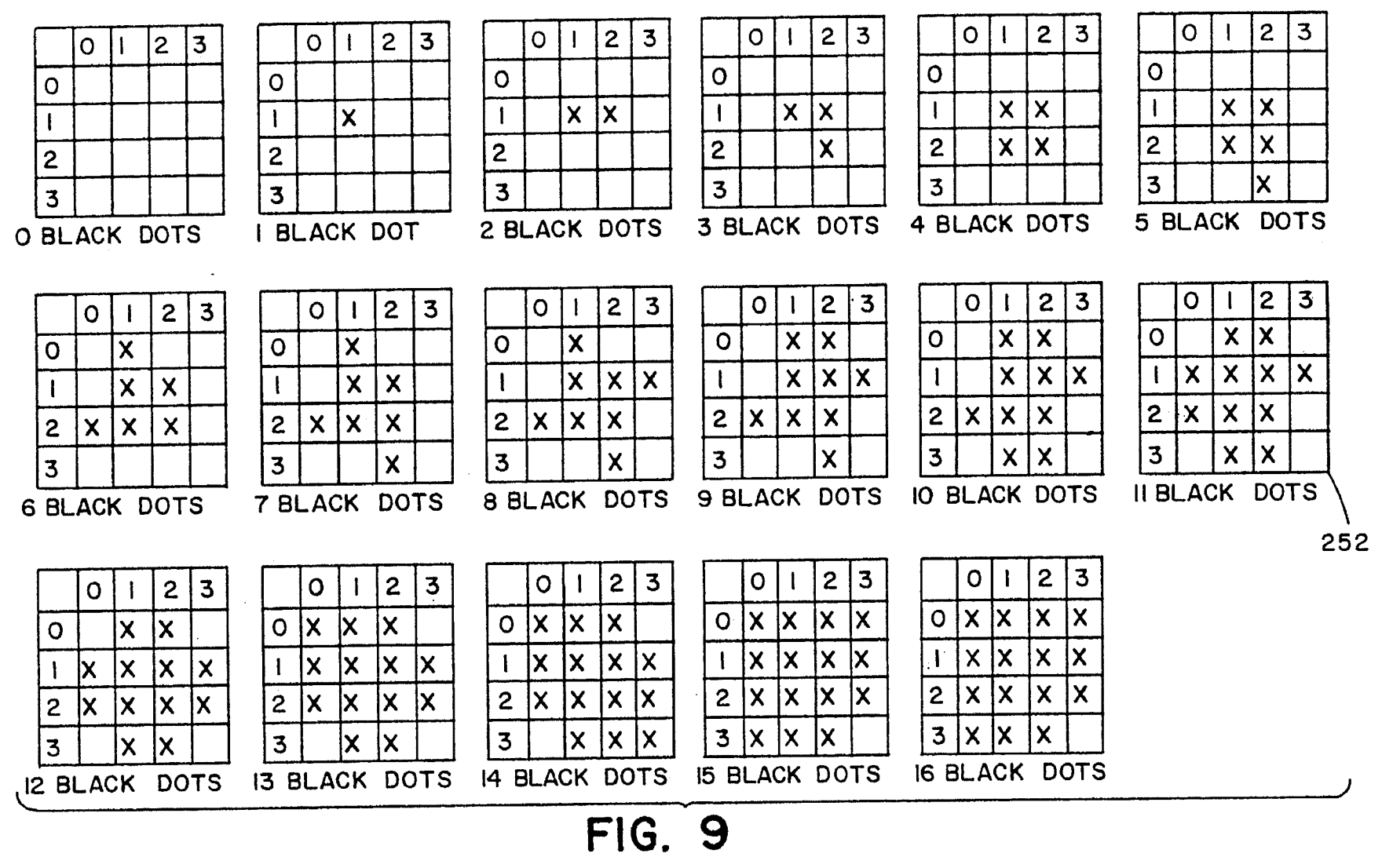
Figure 10:
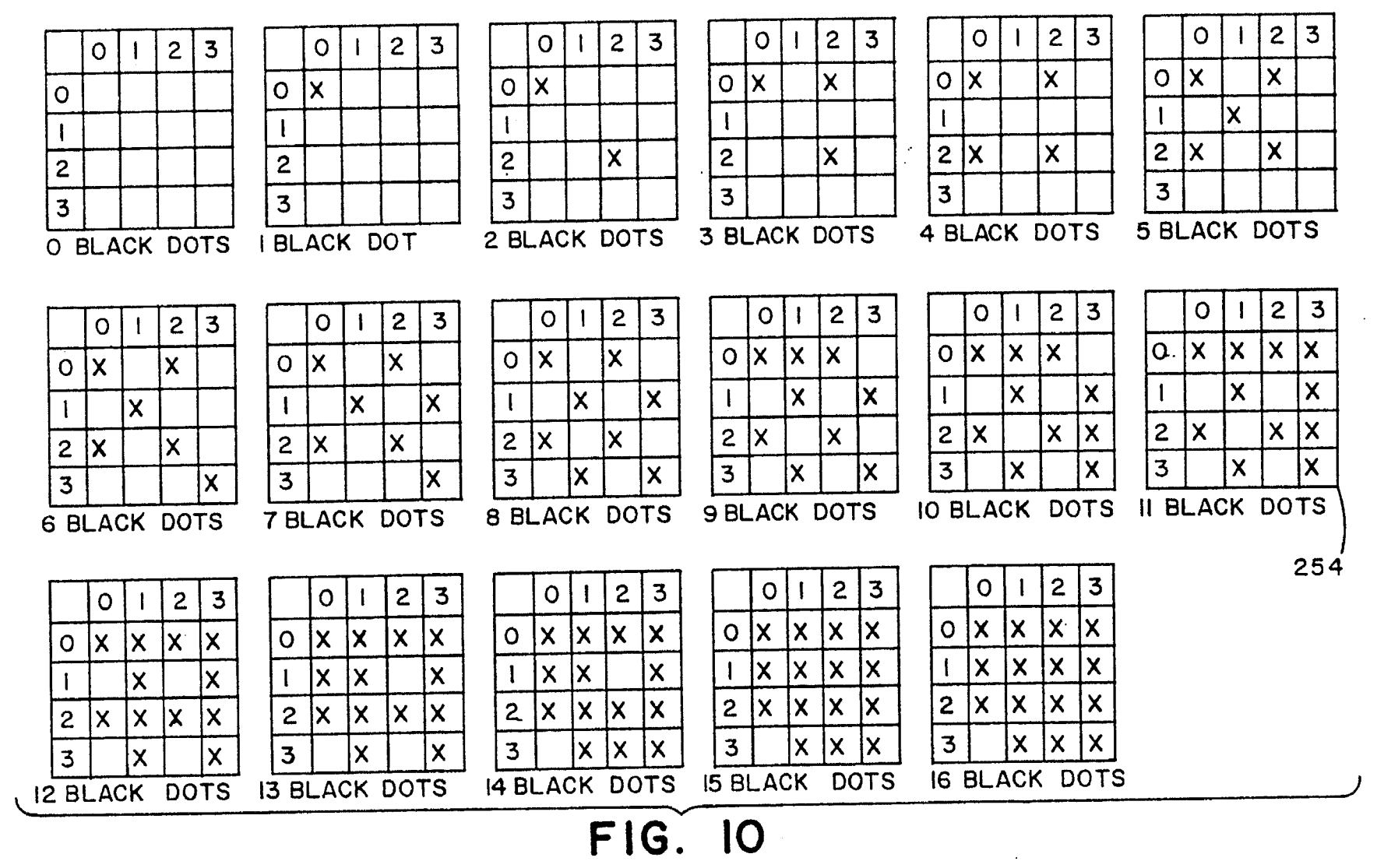

Turning to FIGS. 8, 9 and 10, details of the procedures described in boxes 228 and 230 in FIG. 7 will be considered. Initially, as above indicated, each byte in a subimage is examined and compared to the clustered/dispersed values in the neighbor table (box 243). Any byte matching a clustered entry is assigned a +1 value; matching a dispersed entry is assigned a −1 value; and if neither (don't know), is assigned a zero value (box 244). The assigned values are then summed (box 246) and stored in association with the subimage. Next, 4×4 bit blocks of the subimage are accessed (box 248), the number of "on" bits in the subimage counted and a four bit value indicating the number of "on" bits is assigned to the block and stored (box 250). A count of sixteen is stored as a fifteen. In this manner, each 4×4 bit cell of a subimage is represented by a 4 bit value and a further assigned value that indicates whether the subimage was clustered or dispersed. The 4 bit compressed values are used to represent the original black coverage of the original cells. Decompression will be able to maintain that coverage even though the black data will not necessarily be in the same positions.

When the lossy compressed image is decompressed back to a 4×4 block, it is initially determined whether the block had a clustered or dispersed value assigned to it. If it was assigned a clustered value, a 4×4 matrix from FIG. 9 is chosen in accordance with the four bit value of the block. For instance, if the four bit value indicates that there were 11 "on" or black dots, then matrix 252 is the one chosen from those shown in FIG. 9. By contrast, if the block is indicated as dispersed, and the four bit value is again equal to 11, then matrix 254 of "on" dots in FIG. 10 is the one chosen. Thus,the clustered or dispersed indicator determines which group of matrices is employed to perform the decompression and the four bit value determines which matrix in the group of matrices is the one chosen. The patterns in the matrices of FIGS. 9 and 10 are empirically derived and provide for recovery of some of the lost information that is not otherwise directly recoverable from the four bit compression value. These tables are representative of a general case. Tables may vary from device to device.

MEMORY OUT OR LOW PROCEDURES

Figure 11A:
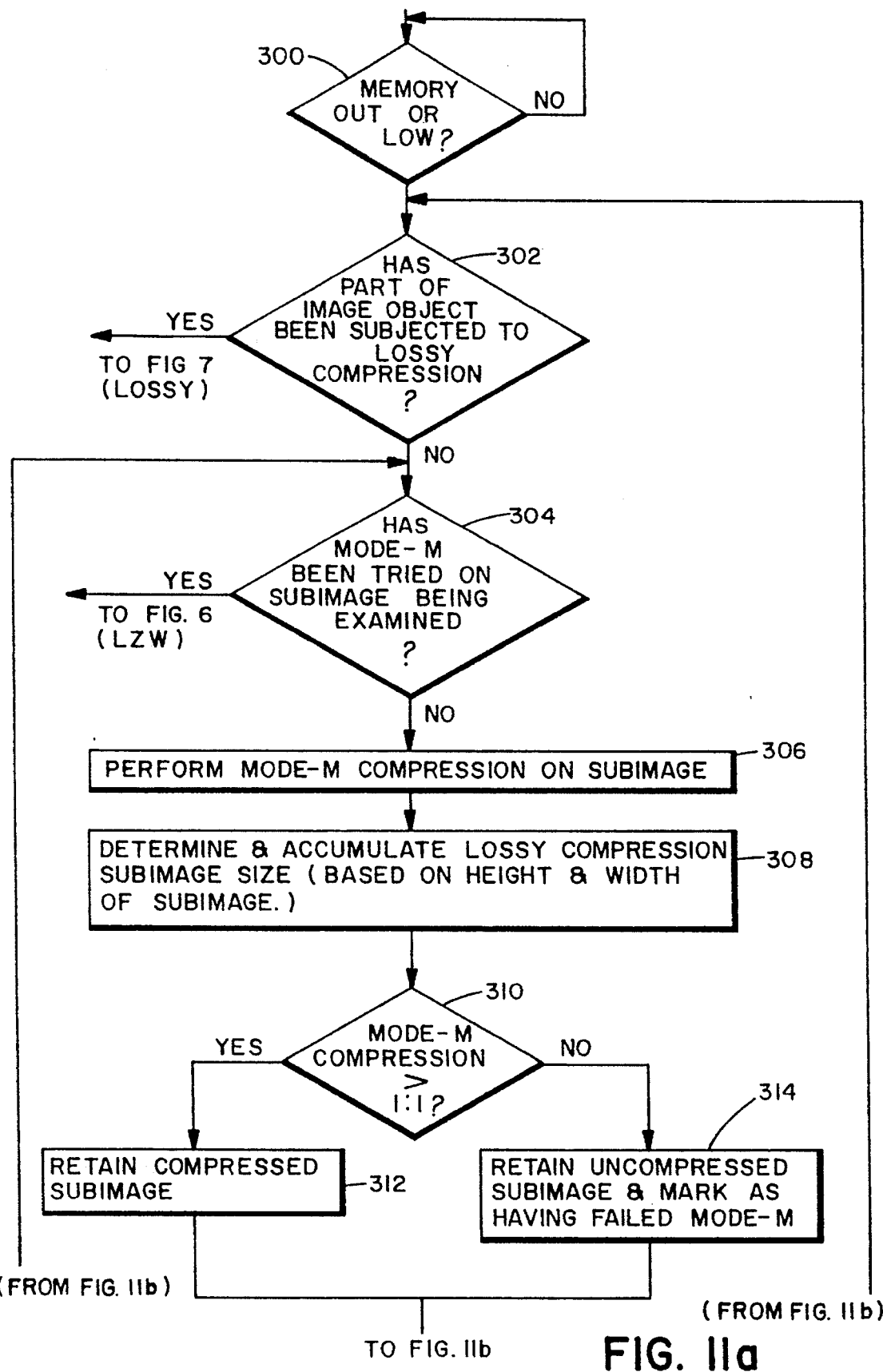
FIGS. 11a and 11b are high level flow diagrams illustrating the procedure following by the system of FIG. 1 in determining which compression procedure to employ in a memory out or low circumstance.

Now that the mode-m, LZW and lossy compression techniques have been described, procedures followed by the invention in the event of a memory out or low indication during page intermediate processing, will be considered. As shown in FIG. 11a, upon a memory out or low indication (decision box 300), it is first determined whether any part of the image has been previously subjected to lossy compression (decision box 302). If yes, the procedure branches to perform lossy compression on the image (as shown in FIG. 7). If no, the image is examined to determine if it has been previously subjected to a mode-m compression (decision box 304). If yes, there is no reason to again try mode-m compression and the procedure branches to attempt an LZW compression (FIG. 6). If the subimage has not been subjected, previously, to a mode-m compression, mode-m is tried (box 306).

At this point, a subimage from the image is examined to determine what it's size would be if it were subjected to a lossy compression. This value can be directly calculated based on the image's height and width (box 308). The calculated value is then used during lossy compression (see box 224 in FIG. 7), wherein it is determined whether previously tried lossless compressions have achieved a better level of compression than can be attained through the use of Lossy compression.

Figure 11B:
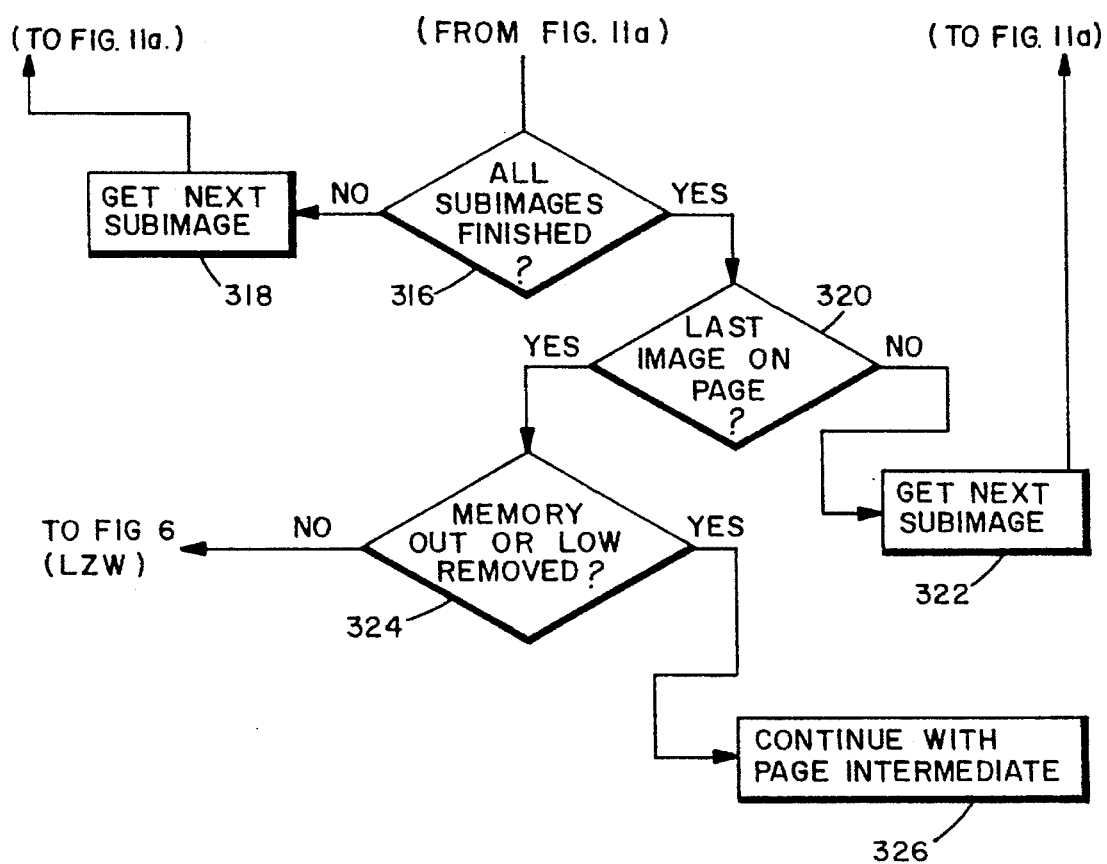

The procedure then determines (decision box 310) whether mode-m compression resulted in a subimage compression of greater than 1 to 1. If yes, the compressed subimage is retained (box 312) and if no, the uncompressed subimage is retained and it is marked as having failed mode-m (box 314). The procedure then determines (see FIG. 11b) whether all subimages have been processed (decision box 316) and if not, obtains the next subimage (box 318) and recycles back to decision box 304 to repeat the compression actions. If all subimages have been processed, it is determined whether the last image on the page has been processed (decision box 320) and, if yes the procedure moves to determine whether the memory out or low condition has been removed (decision box 322). If no, the procedure branches to attempt an LZW compression on the page's subimages.

If it is determined that still further images remain to be compressed (decision box 320), a new image is accessed (box 322) and the procedure recycles back to decision box 302. Once the memory out or low condition is removed, the procedure continues with page intermediate (box 326).

It can now be seen that a variety of data compression techniques are available for use in a printer that embodies this invention; that the data compression techniques are utilized in a sequence that is based upon the beneficial characteristics of each compression technique (i.e. fastest used first); and that the choice of which data compression technique to use is made, based upon the success (or lack of success) of a previously used data compression technique. In such manner, image data is compressed only when necessary and then through the use of the best suited technique—with the Lossy technique being the last choice.

ADAPTIVE COMPRESSED PAGE PROTECTION

Returning to FIG. 2, at the conclusion of page intermediate processing (box 72), a page complete indication (decision box 90) is issued. During processing of the page intermediate strips, as each instruction is stored, an empirically derived "complexity constant" for the instruction is accumulated to create a composite "complexity value" for the strip.

Figure 12A:
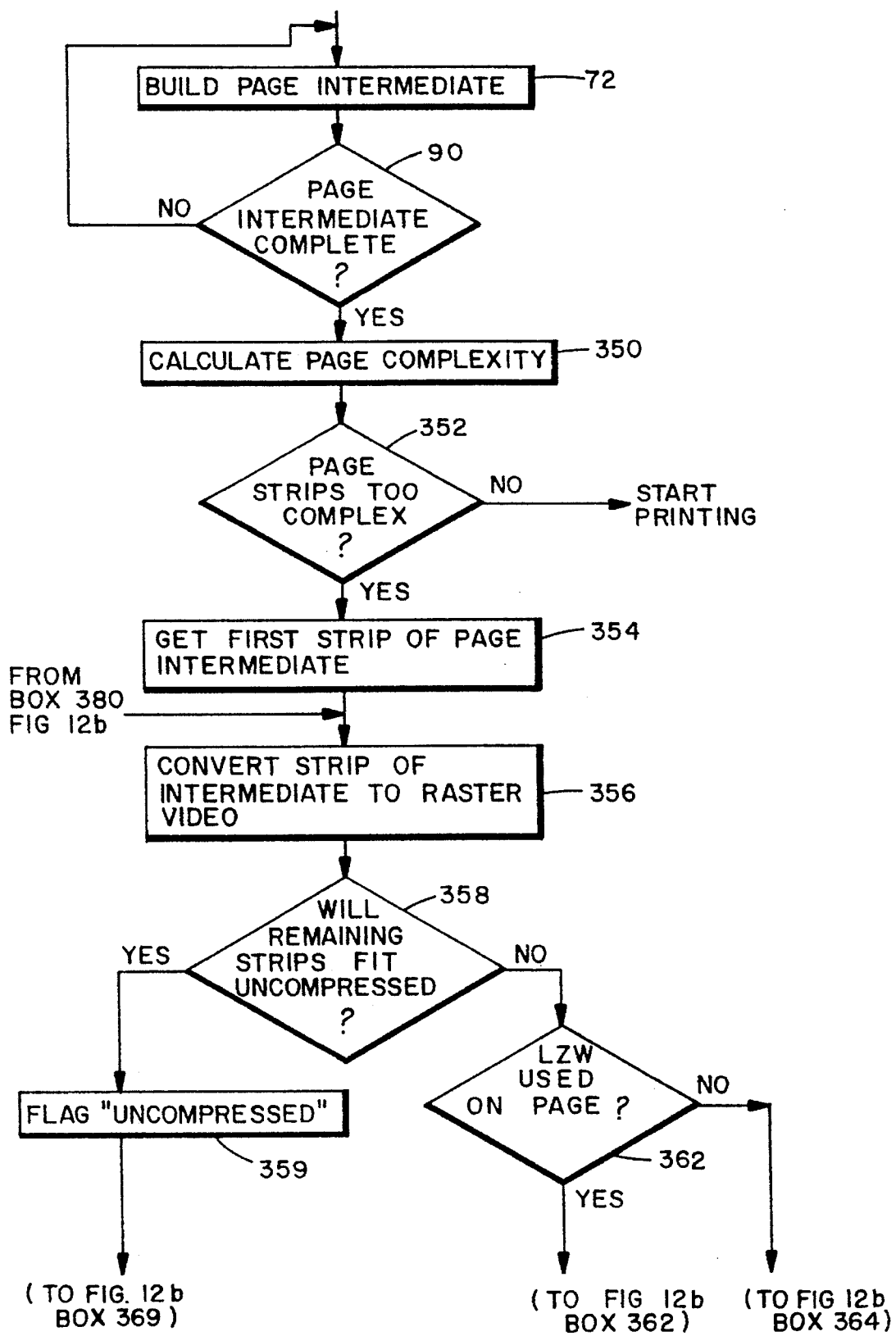
FIGS. 12a, 12b and 12c illustrate a high level flow diagram for the procedure followed when "page intermediate" actions have been completed and it is found that a page is too complex.
Figure 12:
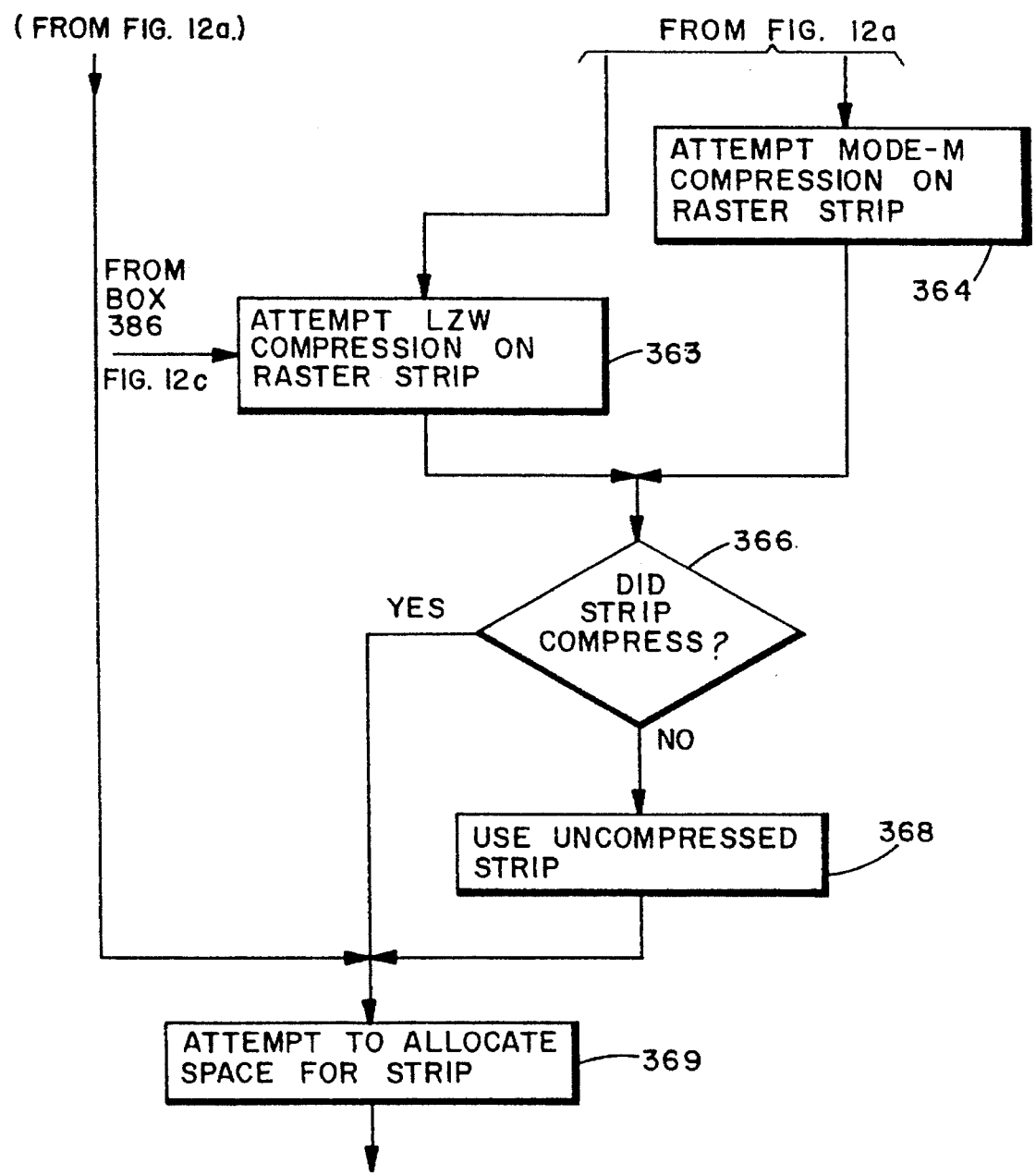
Figure 12C:
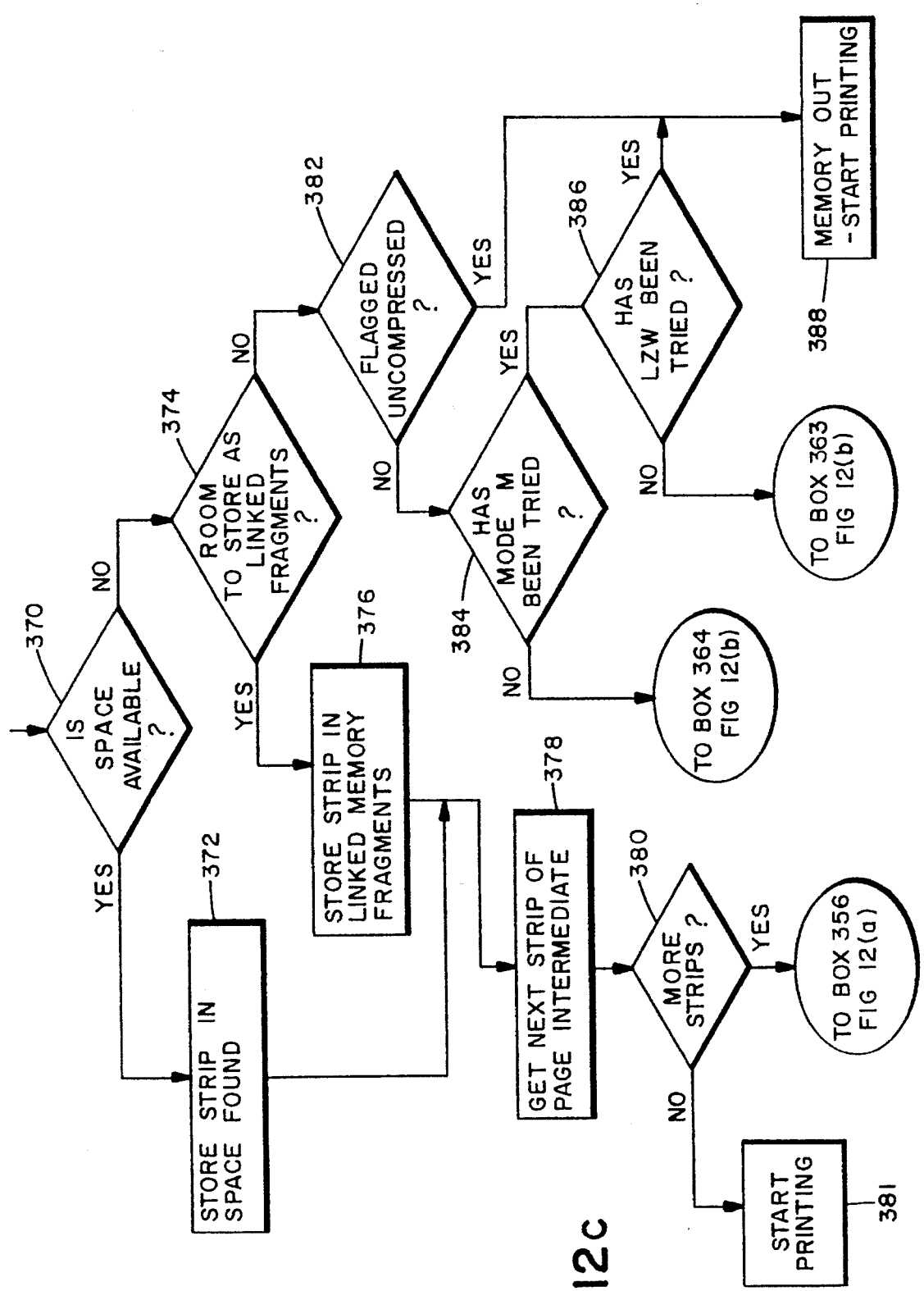

Page complexity is an estimate of the time that it will take to render the page intermediate into video raster. If the estimated time (or a portion thereof) is longer than the print engine allows, page protection is employed and the actions shown in FIGS. 12a–12c are commenced. Page complexity time is estimated by reading each strip's page intermediate objects, including subimage objects (and instructions contained therein) and accumulating an estimated time based upon how long each object will take in the process of conversion to raster video. The estimates are made based upon the height and width of the image object and constants that indicate how long the image processing will take to render each instruction of the objects.

If at any time in the process of estimating page complexity times, (i.e., time to convert strips to raster video), the cumulative estimate becomes at least one engine strip time greater than the print engine will accommodate, compressed page protection turns on. Page complexity time can also be calculated by allowing the printer to convert a strip to raster and timing the process (timed pre-rasterized).

Page complexity time can be empirically measured by timing the strip preparation with a system timer. This technique can reduce the uncertainty associated with strip complexity calculations without slowing page processing. If a calculated strip complexity is below an ok-threshold, then it certainly will not cause a print overrun, and will not be pre-rasterized. Similarly, if the calculated strip complexity is above a will-print overrun-threshold, then the offending strip would definitely cause a print overrun, and must be pre-rasterized. When the strip complexity is between the ok-threshold and the will-print overrun-threshold, an empirical measurement reduces the uncertainty of print overrun substantially. If the empirical measurement classifies the strip as non-print overrun, and the memory required for the intermediate is less than the strip (or a compressed version of the strip), the preorasterized data is discarded, and the strip is processed in the same manner as other non-print overrun strips. Otherwise, the pre-rasterized data is used and processing continues along the same path as for other print overrun strips. In a practical application of page compression without empirical measurement of uncertain strips, questionable strips would probably be pre-rasterized to err on the conservative side. With the empirical measurement, memory usage can be reduced without a noticeable time or processing penalty.

In FIG. 12a, blocks 72 and 90 are repeated from FIG. 2. Once the page intermediate is indicated as complete, a page strip's complexity composite value is calculated as aforedescribed (box 350). If the complexity value shows that the page strips may be immediately printed, printing commences (decision box 352). By contrast, if the page is too complex, the first strip of page intermediate is accessed (box 354) and it is converted to raster video (box 356).

Once a strip has been converted to raster video, each remaining page intermediate strip is examined to see if it will fit, in an uncompressed state (decision box 358), into the user RAM. If yes, the strip is flagged as uncompressed (box 359. If no, and LZW compression has previously been used on the page (decision box 360), LZW compression is tried on the raster video strip (box 363). By contrast, if LZW has not been used on the page (FIG. 12b), mode-m compression is tried (box 364). It is then determined whether the strip actually compressed (decision box 366) from either compression action and if no, the uncompressed strip is used (box 368) (to avoid using a possibly expanded strip).

Then an attempt is made to allocate space for the strip (box 369). As shown in FIG. 12c, if contiguous if space is found to be available (decision box 370), the strip is stored in the found space (box 372). If no contiguous space is found, it is determined whether there is room to store the strip as linked memory fragments (decision box 374). If yes, the strip is stored as linked fragments (box 376) and the procedure then accesses a next strip of page intermediate (box 378) and determines whether there are any more strips to be processed (decision box 380). If there are no more strips, printing commences (box 38). If there are additional strips, the next strip is then converted from page intermediate to raster video (box 356) and the procedure continues.

Returning to decision box 374, if it is found that there is no room to store the strip as linked fragments and the strip is flagged as uncompressed, a memory out indication occurs and printing commences. If the strip is not flagged as uncompressed, then either mode-m or LZW compression is tried (decision boxes 384, 386) depending upon which one has been previously tried. If both mode-m and LZW have been tried, printing commences (box 388).

In summary, strips of page intermediate (or a selected subset of complex strips), in consecutive order down the page, are converted to raster video and placed in a temporary buffer. If LZW compression has been used anywhere upon the page, LZW is attempted, otherwise mode-m is attempted. The reason for this is that if LZW has been previously used on the page enough to cause the page to need page protection (it is too complex), mode-m will probably not be able to better compress the page.

After compression, an attempt is made to find storage for the raster strip in either the main memory or, if that fails, in pieces of main memory or in an emergency memory pool that is set aside for such circumstances. Once the procedure is finished, page printing starts and since the complexity of "strip sized" compressed objects is much lower than what the maximum complexity allowed by the print engine, the page prints with no overrun.

Figure 13:
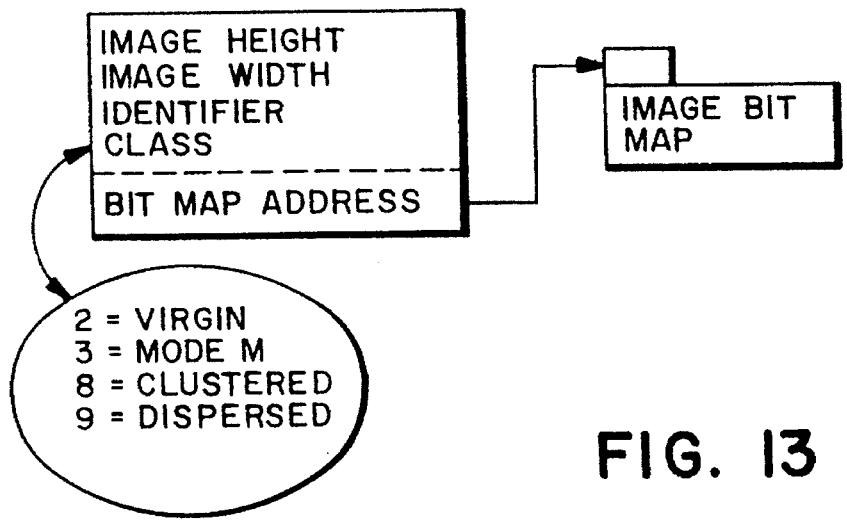
FIG. 13 illustrates a descriptor that accompanies a bit map subimage in a second version of the invention.

The above description has considered data compression as applied to images having contiguously stored descriptors. An image descriptor may also be stored separately from a bit map subimage. Where the descriptor resides is an arbitrary means of distinguishing between two methods of implementing the invention hereof. Referring to FIG. 13, an exemplary image descriptor is shown. The descriptor includes a definition of an image's height, its width, an image identifier (e.g., serial no.) and a "class" notation. The image descriptor further indicates an address of its associated image bit map elsewhere in memory.

The "class" notation in an image descriptor is an entry that indicates facts about the image that are employed during data compression and decompression. For instance, a "2" entry indicates that the image is "virgin" and has been subjected to no data compression actions. A "3" entry indicates that the image has been subjected to mode-m data compression. Entries of "8" or "9" indicate that the image is either clustered or dispersed, as the case may be. Other class notations will indicate data compression procedures that have been used on the image i.e. LZW, lossy etc. When a noncontiguous image descriptor is used raster video bit maps of the raster graphics are totally separate from the descriptors and only the pointers to the bit maps in the descriptors are changed when compression is done. There is no need to modify the page intermediate (display list) and the compression system has no knowledge of the page intermediate.

SAMPLED SUBIMAGE COMPRESSION

This compression technique is initiated when a memory low condition is triggered by an unsuccessful memory allocation request. It involves a sampling of subimages within an image; an attempted compression of the sampled subimages; a prediction of expected overall image compression as derived from the sampled subimage compression experience; and an application of a successful compression technique to all subimages of an image. During the procedure, a predefined set of memory allocation operations, including compression, are sequenced by priority and when attempted lossless methods do not provide the needed memory space, lossy methods are used. As a last resort, conversion from lossless to lossy compression may be performed on any lossless image that compressed less than the standard lossy ratio of 4x.

Figure 14:
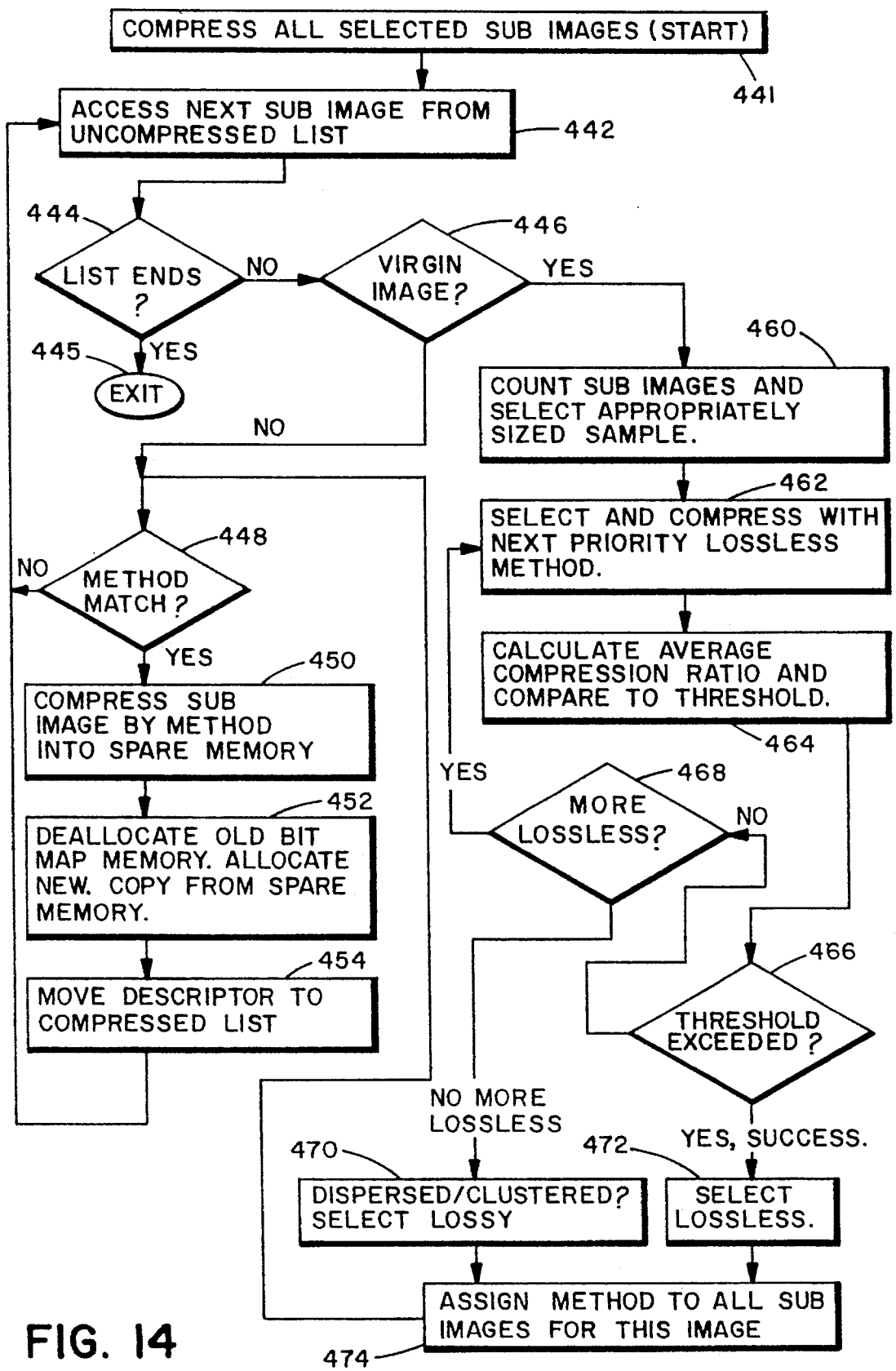
FIG. 14 shows a flow diagram of the procedure followed by the second version of the invention in determining which compression procedure to employ.

As shown in FIG. 14, the procedure is entitled "compress all selected subimages". Initially, all subimages within an image are allocated to either an uncompressed list or a compressed list, as the case may be. Thus, at the commencement of the procedure, all subimages are listed in the uncompressed list as they have not yet been subjected to compression. The procedure commences (box 441) by accessing a next subimage from the uncompressed list (box 442). It is then determined whether all subimages in the list have been completed (decision box 444) and if so, the procedure exits (box 445). If no, a check of the subimage's descriptor is made to determine if the image to which the subimage belongs is of "virgin" status, i.e., uncompressed, (decision box 446). If the image is not virgin, the subimage is processed as shown down the left side of FIG. 14. That procedure will be described below.

If it is determined that the image is "virgin", then it proceeds through a classification procedure illustrated on the right side of FIG. 14 that involves assigning a compression method to be used on all subimages belonging to the image. The procedure commences as shown in box 460 by counting all subimages within the image and selecting an appropriate sized sample of the subimages. The size of the sampled subset varies with the available number of subimages. If the number of subimages is less than 16, than all subimages are used. If a greater number of subimages is present, then a fraction of the total number is used, with the fraction growing smaller as the number of subimages increases. Preferably, the subset is never less than 1 out of every 6 subimages. Clearly, the above numbers and ratio are given as a preferred example, and those skilled in the art will realize that the numbers and ratio values can be varied in accordance with specific circumstances.

Each of the selected subimages is then compressed with a "next" priority lossless method. Initially, mode M is used as it is the fastest in compression and decompression. Once all subimages in the sample have been compressed using the selected lossless method, an average compression ratio (box 464) is calculated and compared to a predetermined compression threshold. If the compression method is found to result in a compression ratio that exceeds the threshold, then that method is immediately selected as shown in decision boxes 466 and 472. Once the method is selected, it is assigned to all subimages for the image (box 474) and the procedure moves to the left side of FIG. 14.

If the threshold is not exceeded and there are other lossless compression techniques that have not yet been tried (decision box 468), the procedure recycles back to box 462 and attempts the next lower priority lossless method. If decision box 468 indicates that there are no more lossless methods available, then a lossy technique is employed and the image is determined to either be dispersed or clustered (box 470). Again, the lossy method is assigned to all subimages of the image and the procedure moves to decision box 448.

During the classification procedure, compression takes place of a selected sample of subimages, however the results of such compression are not retained—except for purposes of calculation of compression ratios and comparison to the aforesaid threshold. Actual compression of images and subimages occurs as shown on the left side of FIG. 14.

During compression of images on a page, all images that have been allocated to a common compression method are handled sequentially, with images assigned to another compression method being handled next in sequence. Thus, in all cases, decision box 448 checks if the current subimage belongs to an image whose assigned compression method matches that presently being employed in the compression routine "compress all selected subimages". If there is no match, then a next subimage in the uncompressed list in box 442 is accessed and the procedure repeats. If there is a match and the proper compression routine is being performed, compression is immediately performed on the respective subimages and the results are stored in spare memory, as shown in box 450. Once subimage compression is finished, the old bit map memory is deallocated. Next, the descriptor for the compressed image is moved to the compressed list (box 454) and the procedure recycles to access a next subimage.

FONT COMPRESSION

Figure 15:
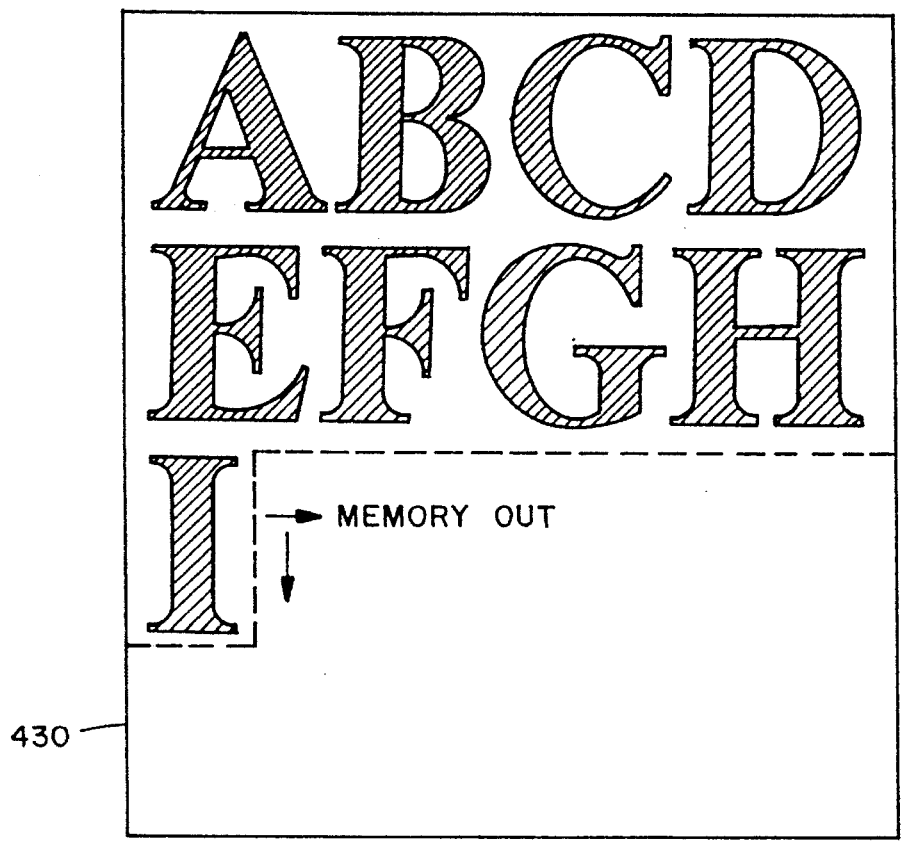
FIG. 15 is a diagram of a page that indicates where a "memory out" indication occurs in response to the printing of a large point size font.

In high speed laser printers, fonts have generally not been subject to compression routines. Certain printer control languages, however, require that font bit maps be contiguous within the printer's memory (e.g. PCL). This is not a problem for smaller fonts because the associated bit maps are small and do not occupy substantial memory regions. However, large fonts create memory-out problems as the block size needed to store such a font grows as the square of the font "point" size. Large numbers of contiguous blocks may not be available in the printer when such a large font is received. Furthermore, reserving huge contiguous blocks of memory is wasteful and is to be avoided if possible. Also, given a large font size, (such as shown in FIG. 15) printed on page 430, an out of memory condition occurs well before the entire page has been printed with the desired font. To avoid such a situation, data compression is applied to received fonts.

Figure 16:
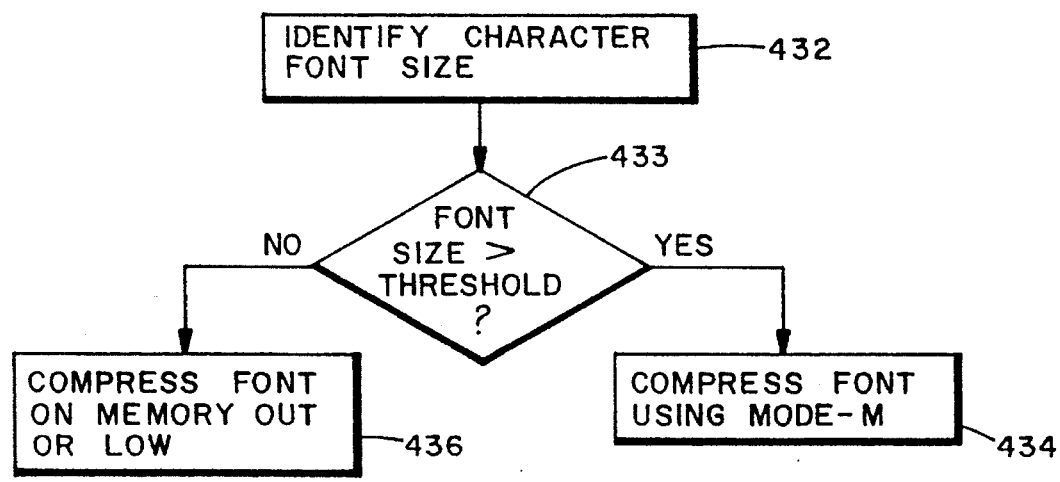
FIG. 16 is a flow diagram illustrating when compression is applied to a received-font.

Turning to FIG. 16 the font compression procedure first identifies the character font size (box 432). If the font size is greater than a predetermined threshold (decision box 433), the font is immediately compressed using mode-m (box 434). By contrast, if the character font size is less than the threshold, no immediate compression action occurs, with the compression action being reserved (box 436) until a memory out or low indication results.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. In a peripheral unit that converts an input data flow to a page-arranged output, said peripheral unit including random access memory with allocated memory space for storing only a portion of said page-arranged output, a processor and control memory containing a plurality of data compression procedures, each said procedure exhibiting a speed of compression performance characteristic, a method for compressing portions of said input data flow for storage in said random access memory, said method comprising the steps of:

allocating portions of said input data flow for storage in said random access memory;

determining when an insufficient amount of said random access memory is available for allocation to said input data flow portions;

employing a first data compression procedure upon a said input data flow portion to produce a compressed data portion, said first data compression procedure generally accomplishing data compression in less time than other data compression procedures available in said peripheral unit;

testing a compression level of said compressed data portion against a compression threshold to determine if said compression level exceeds said threshold, and if not, employing another data compression procedure and repeating said testing in relation to a threshold, whereby a compression procedure is found that enables the compression level of said input data flow portion to exceed a said threshold and is employed to compress said data flow portion.

2. The method as recited in claim 1 wherein said data compression procedures comprise ones which compress data in a lossless manner and at least another which compresses data in a lossy manner, data compressed in a lossless manner being decompressible with no loss of data and data compressed in a lossy manner being decompressible only with loss of data, a said lossless compression procedure being employed first before said lossy compression procedure.

3. The method as recited in claim 2 wherein one said lossless compression procedure is a Lempel/Ziv/Welch (LZW) compression procedure, said procedure building a table of received data strings and assigning a code to each said string, the method further comprising:

limiting the number of string entries in said table to less than a maximum required to obtain optimum data compression, so as to limit a code length required to identify a said string, thereby enabling compression and decompression actions to occur at a faster rate.

4. The method as recited in claim 1 wherein subsequent to said allocating step but prior to said determining step, the method comprises an additional step of:

determining if any said data portion exceeds a predetermined data size, and if so, further determining if allocatable memory remaining within said random access memory is less than a predetermined level, and if both determinations are affirmative, subjecting said data portion to data compression.

5. The method as recited in claim 4 wherein said data compression is accomplished by use of a lossless compression procedure.

6. The method as recited in claim 5 further comprising the steps of:

storing said data portion in random access memory after it has been data compressed; and adjusting said predetermined level by subtracting therefrom memory space taken by said stored data portion.

7. The method as recited in claim 1 wherein said peripheral unit includes a print engine that, when operative, runs at a constant speed, said method comprising the additional steps of:

calculating a complexity factor for data portions within a page and determining if said complexity factor indicates that too great a time will be required to convert said data portions to a raster video format in relation to said print engine speed; and upon such a determination, subjecting at least one data portion to immediate conversion to a raster video format and performing data compression thereon.

8. The method as recited in claim 7, wherein if at any time subsequent to said conversion and compression of said one data portion, it is determined that remaining data portions can be acted upon without causing a memory out indication, said remaining data portions are converted to raster video without compression.

9. The method of claim 1 wherein a said image data includes font data, the method comprising the further step of:

automatically applying a lossless compression technique to said font data if a font represented by said font is at least equal in size to a predetermined level.

10. The method of claim 9 wherein, if said font size is not equal to said predetermined level, applying said lossless compression technique only in the event random access memory for storing said image data is insufficient in capacity.

11. A method for data compressing a raster pixel image, comprising the steps of:

a. performing run-length encoding for data segments in an initial raster row of said image and outputting, for each run of a data segment in said row, a run length command indicating a run count and an identification of the run data segment; and b. for data segments in a subsequent row of said image, comparing whether said data segments are the same as or different from data segments in an immediately previous raster row; and c. issuing commands which identify for said subsequent raster row, which of said data segments exhibit said "same" condition and further indicate said different said data segments.

12. The method as recited in claim 11 wherein step(b) further identifies a presence of a run of data segments in a said subsequent raster row and outputs a run command comprising a count and an identity of the data segment that is repeated in said run.

13. The method as recited in claim 12 wherein said further identification of a run of a data segment only occurs after a different data segment is determined and before a same data segment is next detected.

14. The method as recited in claim 13 wherein run length encoding may span from raster row to raster row until a said run ends.

15. The method as recited in claim 11 wherein said command issued in step c includes a count of the number of same data segments, followed by a count of and an identity of different data segments that follow said same data segments.

16. The method as recited in claim 11 further comprising the step of:

eliminating any commands issued for a raster row if said row is found to be identical to an immediately adjacent row; and issuing a repeat row command that causes said immediately adjacent row to be repeated.

17. The method as recited in claim 11, further comprising the steps of:

inserting an end of row command when a run of zeros is sensed at an end of a row; and upon decompression, padding with zeros any row that ends prior to a predetermined row length.

18. A method for data compressing a raster-arranged pixel image, comprising the steps of:

a. providing a first table of data segment patterns indicative of an image comprised of clustered bit patterns and of an image comprised of dispersed bit patterns;

b. comparing data segments of an image to said data segment patterns in said first table to determine a classification of said image, said classification comprising clustered or dispersed;

c. compressing said image by reducing each n×n bit block of said pixel image to an n-bit data segment and accompanying said compressed image by a classification indicator; and d. decompressing said image by employing said n-bit data segment to access a stored n×n pixel matrix from a pair of matrix tables in accordance with said classification indicator, one said tables including n×n-bit images classified as clustered and another said table including n×n-bit images classified as dispersed, each said table addresses in accordance with said n-bit data segment.

19. The method as recited in claim 18 wherein said image is classified as either clustered or dispersed by assigning a first value to any data segment of said image that matches a clustered data segment pattern in said first table and assigning a second value to any data segment that matches a dispersed data segment pattern in said first table, said classification determined by combining said first and second values and comparing said combined values to a threshold.

20. The method as recited in claim 19 wherein said first values are positive numbers and said second values are negative numbers, said threshold being a neutral value therebetween.

21. In a peripheral unit for converting an input data flow to a page—arranged output, said peripheral unit having insufficient random access memory allocated to store an entire video raster image of said page arranged output, a method for converting said input data flow to a page intermediate form that includes a plurality of image strips that make up said page arranged output, each image strip including image processing commands that enable subsequent conversion of each said image strip to a raster video form, said method comprising:

a. establishing a threshold value of data segments in an image strip;

b. determining (1) if a number of data segments in an image strip exceeds said threshold value, and (2) if remaining memory in said random access memory is less than a predetermined level and if said determinations 1 and 2 are affirmative;

c. converting said image strip immediately to raster video and attempting a compression thereof;

d. storing in said random access memory, compressed raster video that results from step c;

e. adjusting said threshold value to a smaller value to account for remaining random access memory in said random access memory; and f. repeating steps a–e for remaining image strip of said page.

22. The method as recited in claim 21 wherein step (c) employs a compression action that examines blocks of raster data and performs compression actions that take into account both vertical and horizontal data redundancies in each said block of raster data.

23. The method as recited in claim 22 wherein said compression action comprises the steps of:

providing output commands which indicate vertical redundancies existing between succeeding rows of a block of raster data and further providing commands indicative of horizontal data redundancy occurring in a said row.

24. A method as in claim 21 where the strip complexity can be empirically determined by measurement with a system timer, and this result used to ascertain whether to pre-rasterized the strip when the complexity prediction is within the uncertain complexity window.

25. In a peripheral unit that converts an input data flow to a page-arranged output, said data flow including data describing an image, a said image comprised of a set of subimages, each subimage further comprised of a video raster bit map and a descriptor having a field that identifies where said video raster bit map is stored, a method for compressing data representing a said image and subimages, comprising:

selecting a group of descriptors that represent a subset of said set of subimages;

attempting to compress, through the use of a first compression technique, the video raster bit map associated with each said selected descriptor;

comparing against a threshold, a level of compression of said subset of subimages achieved through said compression attempt and if said threshold is at least equalled, employing said first compression technique to data compress all subimages comprising said image.

26. The method as recited in claim 25 wherein each said descriptor has fields reserved for indicating facts regarding an associated video raster bit map, said method further comprising:

employing a second compression technique upon said subset of subimages in the event said level of compression is not equalled and again comparing an achieved level of compression against a threshold and employing said second compression technique for all subimages of said image in the event said threshold is at least equaled.

27. The method as recited in claim 26 wherein said facts in each said descriptor are employed during decompression of said image, said facts indicating the method of compression employed to compress said video raster bit maps.

28. The method as recited in claim 27 wherein at least said first compression method is lossless.

29. The method as recited in claim 28 wherein said peripheral unit includes random access-memory (RAM) whose capacity is insufficient to store an entire page of said page-arranged output, said method comprising the further steps of:

determining, subsequent to application of a said compression technique, whether sufficient space is available in said RAM to store a compressed image and, if not; applying a lossy compression technique to said subimages.

30. The method as recited in claim 29 wherein, as part of said lossy compression technique, said image is classified as either dispersed or clustered by comparison of video raster bit maps of at least some said subset of subimages to a table of entries that define bit patterns comprising clustered and dispersed bit arrangements, said classification employed during decompression of said lossy compressed image.

31. The method as recited in claim 29, wherein said lossy compression technique is employed for said image only if a prior applied lossless compression technique did not exceed a level of compression of said image that is available from said lossy technique.

* * * * *